US012317555B2

(12) United States Patent
Frougier et al.

(10) Patent No.: US 12,317,555 B2
(45) Date of Patent: May 27, 2025

(54) GATE-ALL-AROUND NANOSHEET FIELD EFFECT TRANSISTOR INTEGRATED WITH FIN FIELD EFFECT TRANSISTOR

(71) Applicant: INTERNATIONAL BUSINESS MACHINES CORPORATION, Armonk, NY (US)

(72) Inventors: Julien Frougier, Albany, NY (US); Sagarika Mukesh, Albany, NY (US); Ruqiang Bao, Niskayuna, NY (US); Andrew M. Greene, Slingerlands, NY (US); Jingyun Zhang, Albany, NY (US); Nicolas Loubet, Guilderland, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 866 days.

(21) Appl. No.: 17/303,233

(22) Filed: May 25, 2021

(65) Prior Publication Data
US 2022/0384574 A1  Dec. 1, 2022

(51) Int. Cl.
*H10D 62/10* (2025.01)
*H10D 30/01* (2025.01)
(Continued)

(52) U.S. Cl.
CPC ....... *H10D 62/121* (2025.01); *H10D 30/6211* (2025.01); *H10D 30/6219* (2025.01); *H10D 30/6735* (2025.01); *H10D 62/115* (2025.01)

(58) Field of Classification Search
CPC ............. H01L 29/0673; H01L 29/0649; H01L 29/41791; H01L 29/42392; H01L 29/7851; H01L 29/78696; H01L 27/0924; H01L 27/0886; H10D 30/6735; H10D 30/014; H10D 30/43; H10D 30/6757;
(Continued)

(56) References Cited

U.S. PATENT DOCUMENTS 10,014,389 B2  7/2018  Xie
10,038,053 B2  7/2018  Balakrishnan
(Continued)

OTHER PUBLICATIONS

Veloso et al., "Nanowire & Nanosheet FETs for Ultra-Scaled, High-Density Logic and Memory Applications" Solid State Electronics (2019), doi: https://doi.org/10.1016/j.sse.2019.107736, Journal Pre-proof, 16 pages.

*Primary Examiner* — Mohsen Ahmadi
(74) *Attorney, Agent, or Firm* — Samuel A. Waldbaum

(57) ABSTRACT

A semiconductor structure may include one or more nanosheet field-effect transistors formed on a first portion of a substrate, and one or more fin field-effect transistors formed on a second portion of the substrate. A source drain of the one or more nanosheet field-effect transistors or a gate of the one or more nanosheet field-effect transistors may be separated from the substrate by an isolation layer. A source drain of the one or more fin field-effect transistors or a gate of the one or more fin field-effect transistors may be in direct contact with the substrate. The semiconductor structure may include a gate spacer surrounding the gate of the one or more nanosheet field-effect transistors and the gate of the one or more fin field-effect transistors.

25 Claims, 19 Drawing Sheets

(51) Int. Cl.
*H10D 30/43* (2025.01)
*H10D 30/62* (2025.01)
*H10D 30/67* (2025.01)
*H10D 62/13* (2025.01)
*H10D 62/17* (2025.01)
*H10D 64/01* (2025.01)
*H10D 84/01* (2025.01)
*H10D 84/03* (2025.01)
*H10D 84/85* (2025.01)

(58) Field of Classification Search
CPC .............. H10D 64/017; H10D 84/856; H10D 84/0128; H10D 84/0167; H10D 84/038
See application file for complete search history.

(56) References Cited

U.S. PATENT DOCUMENTS

| | | | |
|---|---|---|---|
| 10,049,944 B2 | 8/2018 | Beasor | |
| 10,141,403 B1 | 11/2018 | Cheng | |
| 10,229,971 B1 | 3/2019 | Cheng | |
| 10,243,054 B1 | 3/2019 | Cheng | |
| 10,332,803 B1 | 6/2019 | Xie | |
| 10,332,881 B1 | 6/2019 | Badaroglu | |
| 10,522,636 B2 | 12/2019 | Yeung | |
| 2016/0111421 A1 | 4/2016 | Rodder | |
| 2018/0006139 A1* | 1/2018 | Seo | H01L 21/3065 |
| 2018/0033871 A1* | 2/2018 | Xie | H01L 21/02532 |
| 2018/0175163 A1* | 6/2018 | Barraud | H01L 29/6653 |
| 2019/0288117 A1* | 9/2019 | Xie | H10D 30/0323 |
| 2019/0326286 A1 | 10/2019 | Xie | |
| 2019/0355724 A1 | 11/2019 | Chiang | |
| 2020/0006479 A1* | 1/2020 | Reznicek | H10D 86/201 |
| 2020/0020689 A1 | 1/2020 | Ohtou | |
| 2020/0105761 A1 | 4/2020 | Liaw | |
| 2020/0365704 A1* | 11/2020 | Chung | H01L 27/092 |
| 2021/0028068 A1* | 1/2021 | Dentoni Litta | H10D 30/0243 |
| 2021/0036144 A1* | 2/2021 | Liaw | H01L 29/66439 |
| 2021/0134677 A1* | 5/2021 | Pan | H01L 21/76205 |
| 2021/0265349 A1* | 8/2021 | Chung | H01L 21/823821 |
| 2021/0384198 A1* | 12/2021 | Chu | H01L 21/31053 |
| 2022/0093596 A1* | 3/2022 | Lavric | H10D 64/015 |
| 2022/0181322 A1* | 6/2022 | Liebmann | H01L 23/528 |

* cited by examiner

GATE-ALL-AROUND NANOSHEET FIELD EFFECT TRANSISTOR INTEGRATED WITH FIN FIELD EFFECT TRANSISTOR

BACKGROUND

The present invention relates to a semiconductor structure and a method of forming the same. More particularly, the present invention relates to a semiconductor structure that includes a gate-all-around (GAA) nanosheet field effect transistor integrated with a fin field effect transistor (Fin-FET) on a semiconductor chip.

Integrated circuit (IC) designs are often driven by device performance, scalability, and manufacturability. For example, GAA nanosheet FETs were developed to improve device drive current and electrostatics and to allow for device size scaling. Further, a full technology node requires Input/Output (I/O) devices. Typically, the I/O devices may be large transistors designed to drive a certain amount of current that is needed to push a signal off-chip in order to drive the high capacitances of package and printed circuit boards loads upon the IC pin.

SUMMARY

According to one embodiment of the present invention, a semiconductor structure is provided. The semiconductor structure may include one or more nanosheet field-effect transistors formed on a first portion of a substrate, and one or more fin field-effect transistors formed on a second portion of the substrate. A source drain of the one or more nanosheet field-effect transistors or a gate of the one or more nanosheet field-effect transistors may be separated from the substrate by an isolation layer and a source drain of the one or more fin field-effect transistors or a gate of the one or more fin field-effect transistors may be in direct contact with the substrate. The semiconductor structure may include a gate spacer surrounding the gate of the one or more nanosheet field-effect transistors and the gate of the one or more fin field-effect transistors. The gate spacer of the one or more nanosheet field-effect transistors may have a different thickness than the gate spacer of the one or more fin field-effect transistors. The gate spacer surrounding the one or more fin field-effect transistors may be thicker than the gate spacer surrounding the gate of the one or more nanosheet field-effect transistors. The gate of the one or more nanosheet field-effect transistors and the gate of the one or more fin field-effect transistors may include a gate dielectric. The gate dielectric within the gate of the one or more nanosheet field-effect transistors may be thicker or thinner than the gate dielectric within the gate of the one or more fin field-effect transistors. The one or more nanosheet field-effect transistors may be a p-type gate-all-around nanosheet field-effect transistors. The one or more nanosheet field-effect transistors may be a n-type gate-all-around nanosheet field-effect transistors. The first portion of the substrate may be a logic device region and the second portion of the substrate may be an I/O device region. The logic device region may include a p-type gate-all-around nanosheet field-effect transistor and a n-type fin field-effect transistor. The logic device region may include a p-type fin field-effect transistor and a n-type gate-all-around nanosheet field-effect transistor.

According to another embodiment of the present invention, a semiconductor structure is provided. The semiconductor structure may include one or more nanosheet field-effect transistors formed on a first portion of a substrate and one or more fin field-effect transistors formed on a second portion of the substrate. A source drain of the one or more nanosheet field-effect transistors or a gate of the one or more nanosheet field-effect transistors may be separated from the substrate by an isolation layer. The one or more nanosheet field-effect transistors may be separated from each other by one or more shallow trench isolations. A source drain of the one or more fin field-effect transistors or a gate of the one or more fin field-effect transistors may be in direct contact with the substrate. The one or more fin field-effect transistors may be separated from each other by the one or more shallow trench isolations. The semiconductor structure may include a gate spacer surrounding the gate of the one or more nanosheet field-effect transistors and the gate of the one or more fin field-effect transistors. The gate spacer surrounding the one or more fin field-effect transistors may be thicker than the gate spacer surrounding the gate of the one or more nanosheet field-effect transistors. The one or more nanosheet field-effect transistors may be a p-type gate-all-around nanosheet field-effect transistors. The one or more nanosheet field-effect transistors may be a n-type gate-all-around nanosheet field-effect transistors. The first portion of the substrate may be a logic device region and the second portion of the substrate may be an I/O device region. The logic device region may include a p-type gate-all-around nanosheet field-effect transistor and a n-type fin field-effect transistor. The logic device region may include a p-type fin field-effect transistor and a n-type gate-all-around nanosheet field-effect transistor.

According to another embodiment of the present invention, a semiconductor structure is provided. The semiconductor structure may include one or more nanosheet field-effect transistors formed on a first portion of a substrate, one or more fin field-effect transistors formed on a second portion of the substrate, a gate spacer surrounding the gate of the one or more nanosheet field-effect transistors and the gate of the one or more fin field-effect transistors, and one or more shallow trench isolations. The one or more shallow trench isolations may separate the one or more fin field-effect transistors from one another. The one or more shallow trench isolations may separate the one or more nanosheet field-effect transistors from one another. A source drain of the one or more nanosheet field-effect transistors or a gate of the one or more nanosheet field-effect transistors may be separated from the substrate by an isolation layer. A source drain of the one or more fin field-effect transistors or a gate of the one or more fin field-effect transistors may be in direct contact with the substrate. The gate spacer of the one or more nanosheet field-effect transistors may have a different thickness than the gate spacer of the one or more fin field-effect transistors. The gate spacer surrounding the one or more fin field-effect transistors may be thicker than the gate spacer surrounding the gate of the one or more nanosheet field-effect transistors. The gate spacer surrounding the one or more fin field-effect transistors may be thinner than the gate spacer surrounding the gate of the one or more nanosheet field-effect transistors. The one or more nanosheet field-effect transistors may be a p-type gate-all-around nanosheet field-effect transistors. The one or more nanosheet field-effect transistors may be a n-type gate-all-around nanosheet field-effect transistors. The first portion of the substrate may be a logic device region and the second portion of the substrate may be an I/O device region. The logic device region may include a p-type gate-all-around nanosheet field-effect transistor and a n-type fin field-effect transistor. The logic device region may include a p-type fin field-effect transistor and a n-type gate-all-around nanosheet field-effect transistor.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
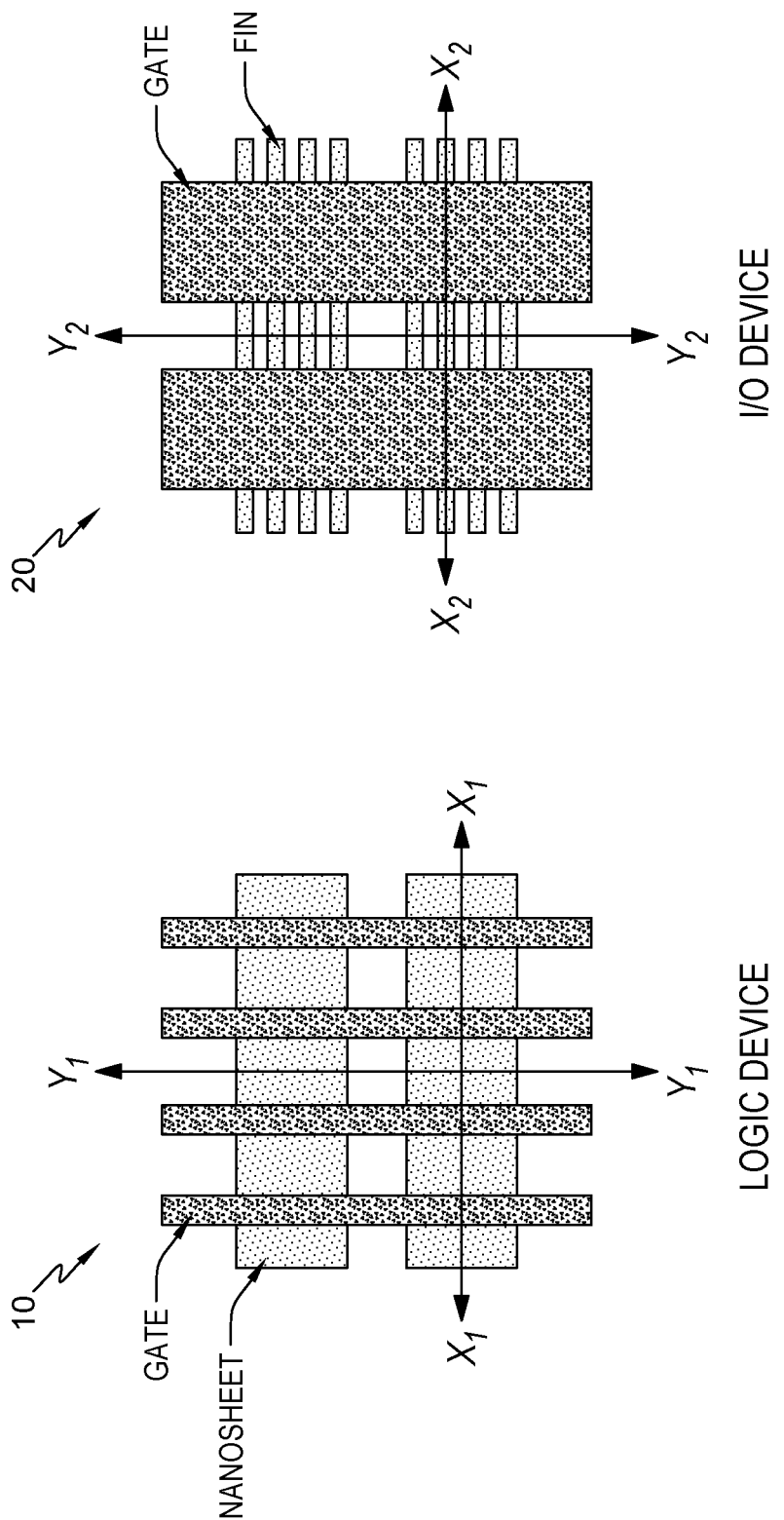
FIG. 1 is a top view illustrating a nanosheet logic device and an I/O device according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Integrated circuit (IC) designs are often driven by device performance, scalability, and manufacturability. For example, GAA nanosheet FETs were developed to improve device drive current and electrostatics and to allow for device size scaling. Further, a full technology node requires Input/Output (I/O) devices. Typically, the I/O devices may be relatively large transistors designed to drive a certain amount of current that is needed to push a signal off-chip in order to drive the high capacitances of package and printed circuit boards loads upon the IC pin.

Current manufacturing processes provide limited options that may enable realistic I/O device integration with nanosheet technology. Further, I/O devices may have specific reliability requirements due to their higher voltage operation ranges such as, for example, 1.2V, 1.4V, or 1.8V. The present invention provides a method and structure that integrates nanosheet logic devices and I/O devices on the same semiconductor chip while improving the high-voltage reliability of the I/O device. Exemplary nanosheet logic devices may include, for example, a gate-all-around (GAA) nanosheet. Exemplary I/O devices may include, for example, fin field effect transistors (FinFET).

FIGS. 1-19 illustrate fabrication of an exemplary semiconductor structure that includes a logic device 10 integrated with an I/O device 20 on the same semiconductor chip. According to the present embodiment, the logic device 10 is a GAA nanosheet structure and the I/O device is a FinFET.

Referring now to FIG. 1, top views of the logic device 10 (hereinafter "structure 10") and the I/O device 20 (hereinafter "structure 20") are shown, in accordance with an embodiment. Section $X_1$-$X_1$ is perpendicular to the logic gate over the nanosheet and section $X_2$-$X_2$ is perpendicular to the I/O gate over the fin. Section $Y_1$-$Y_1$ is perpendicular to the nanosheet and section $Y_2$-$Y_2$ is perpendicular to the fin.

Figure 2:
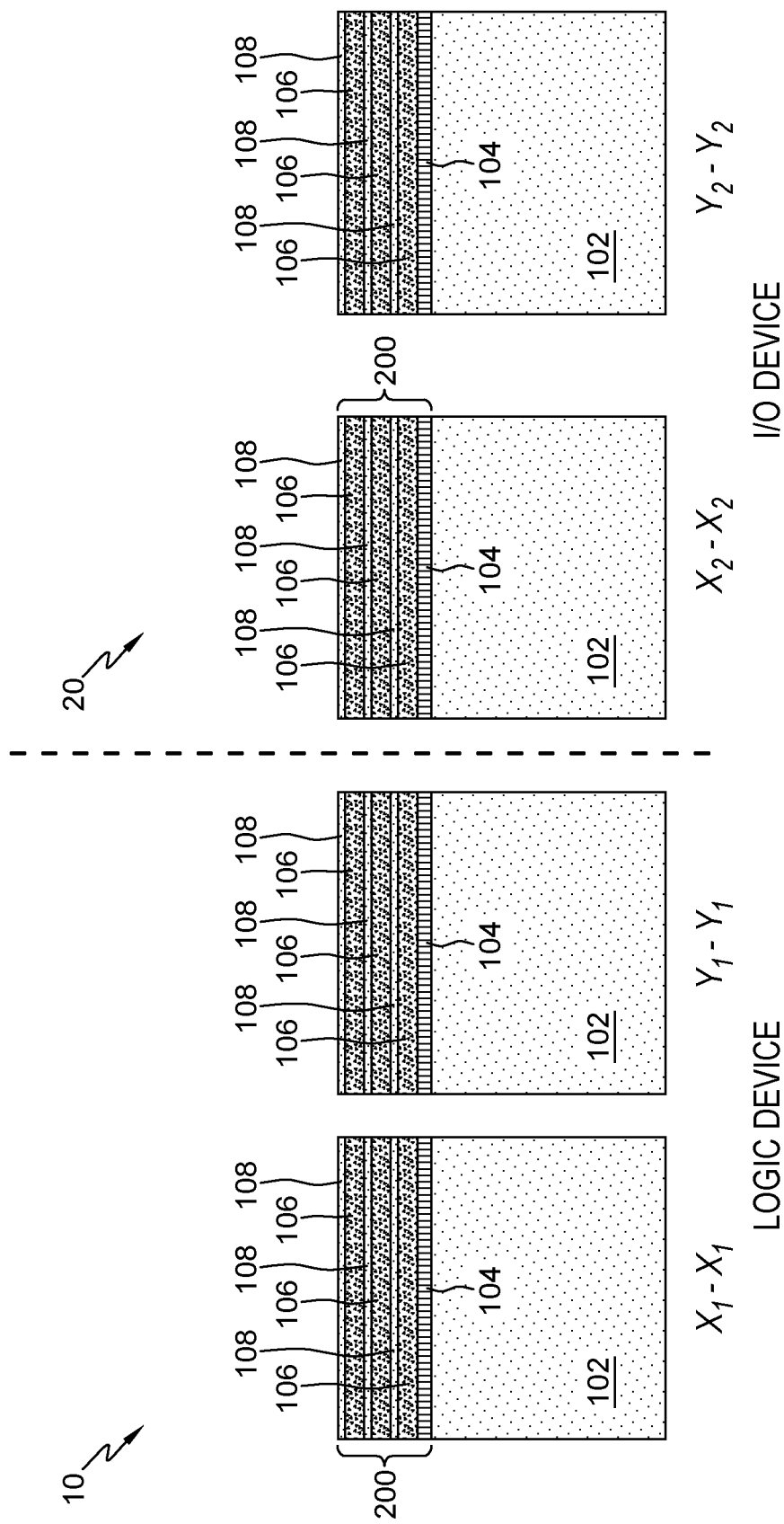
FIG. 2 is a cross section view illustrating two structures each having a nanosheet epitaxy stack formed on a substrate according to an exemplary embodiment.

Referring now to FIG. 2, an epitaxy stack 200 on a substrate 102 is shown, in accordance with an embodiment. The substrate 102 may be made of silicon. The substrate 102 may be divided into one or more portions. For example, in an embodiment, a first portion of the substrate 102 may include the structure 10 and a second portion of the substrate 102 may include the structure 20.

The epitaxy stack 200 is grown on a whole semiconductor wafer using an epitaxial growth processes, such as, for example molecular beam epitaxy (MBE). The epitaxy stack 200 includes a first sacrificial layer 104 arranged on top of the substrate 102. The first sacrificial layer 104 may be made of silicon germanium where the germanium is at a concentration range of about 45% to about 65%. The first sacrificial layer 104 may be referred to as a first silicon germanium layer. On the first sacrificial layer 104 alternating layers of a second sacrificial layer 106 and a nanosheet channel layer 108 are epitaxially grown.

In an embodiment, the epitaxy stack 200 includes three layers of the second sacrificial layer 106 and three layers of the nanosheet channel layer 108 stacked one on top of another. Although only a limited number of layers are shown, the epitaxy stack 200 may include any number of additional layers. The nanosheet channel layer 108 may be made of silicon. The second sacrificial layer 106 may be made of silicon germanium where the germanium is at a concentration range of about 15% to about 35%. As such, the second sacrificial layer 106 includes germanium at a lower concentration when compared to the first sacrificial layer 104. Therefore, the first sacrificial layer 104, the second sacrificial layer 106, and the silicon layer 108 are made of materials with compositions that are selected to be removed selective to each other.

Figure 3:
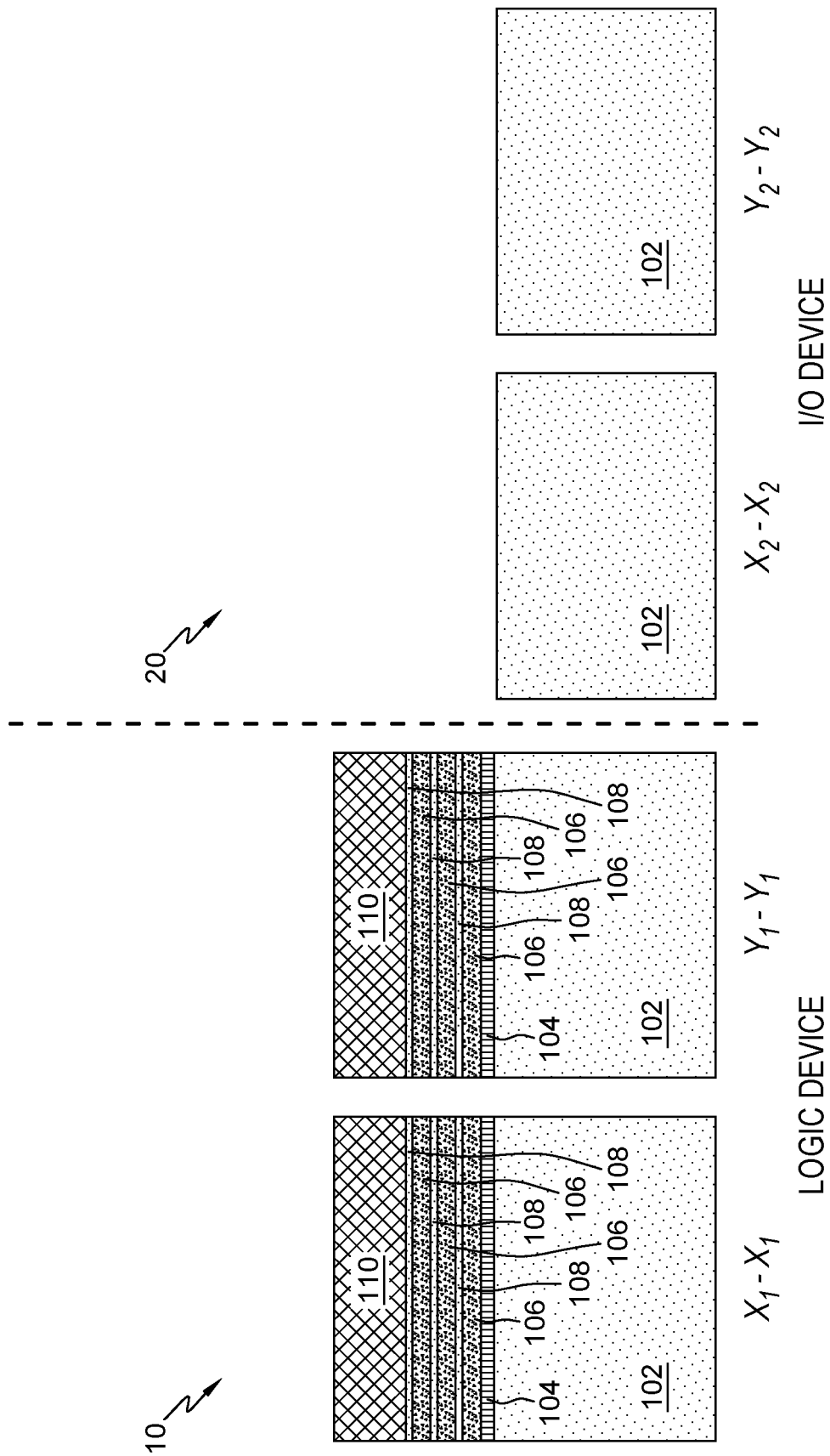
FIG. 3 is cross section views illustrating one structure with a hard mask and another structure with an exposed top surface of the substrate according to an exemplary embodiment.

Referring now to FIG. 3, the structure 10 with a hard mask 110 and the structure 20 with an exposed top surface of the substrate 102 are show, in accordance with an embodiment. The hard mask 110 is first deposited, using known deposition techniques, onto a top surface of the nanosheet channel layer 108. The hard mask 110 is then patterned and remains on top of the nanosheet channel layer 108 of the structure 10 to protect the epitaxy stack 200 of the structure 10 during subsequent recessing of the epitaxy stack 200 of the structure 20. As such, the epitaxy stack 200 of the structure 20 is removed such that the top surface of the substrate 102, of the structure 20, is exposed.

Figure 4:
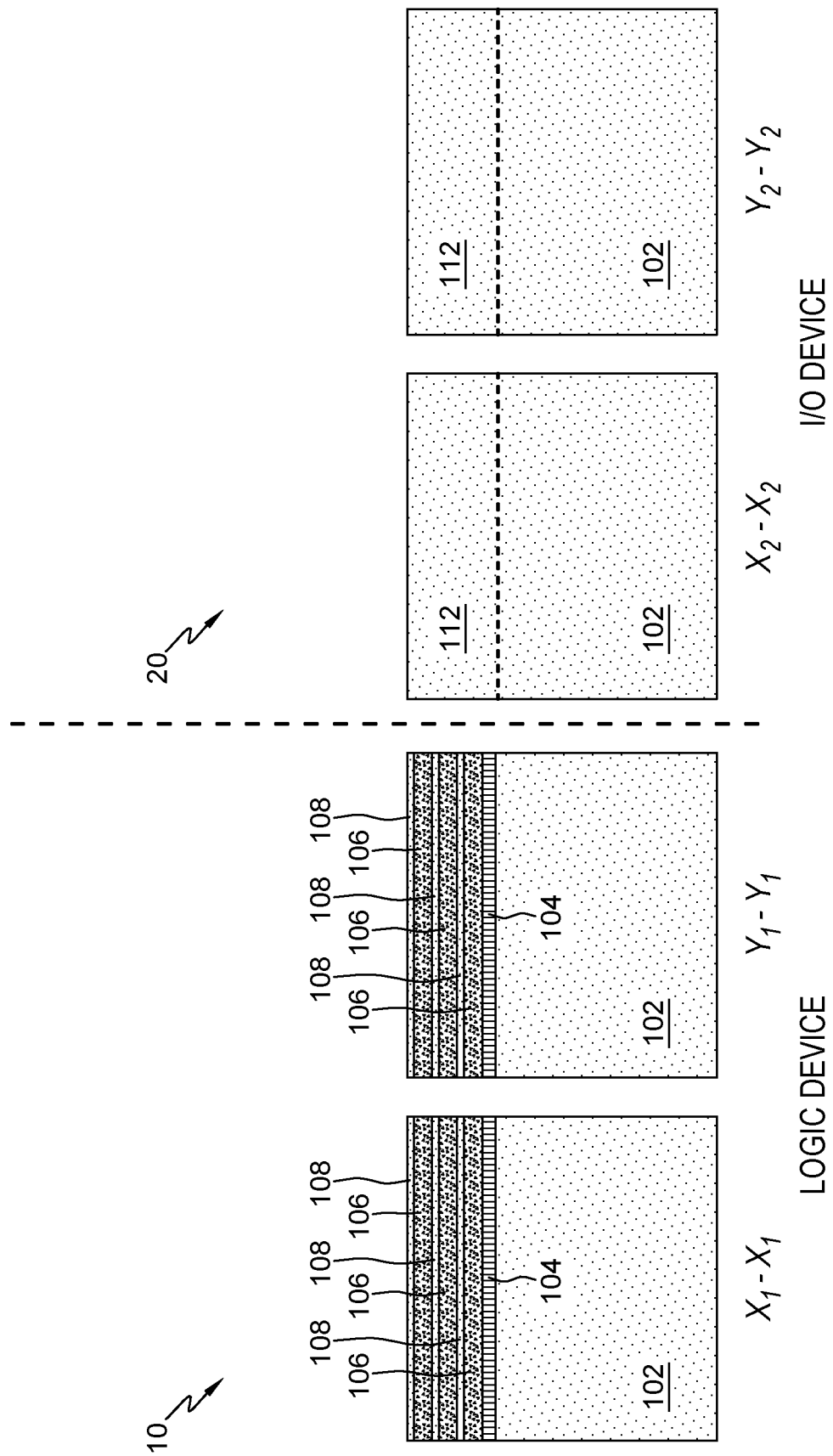
FIG. 4 is a cross section view illustrating one of the structures having a silicon epitaxy layer according to an exemplary embodiment.

Referring now to FIG. 4, the structure 10 with an exposed top surface of the nanosheet channel layer 108 and the structure 20 with a silicon epitaxy layer 112 are shown, in accordance with an embodiment. After the top surface of the substrate 102 within the structure 20 is exposed, the silicon epitaxy layer 112 is epitaxially grown, using known epitaxial growth processes, on the exposed top surface of the substrate 102 within the structure 20. The hard mask 110 from the structure 10 is then removed to expose the top surface of the nanosheet channel layer 108.

Figure 5:
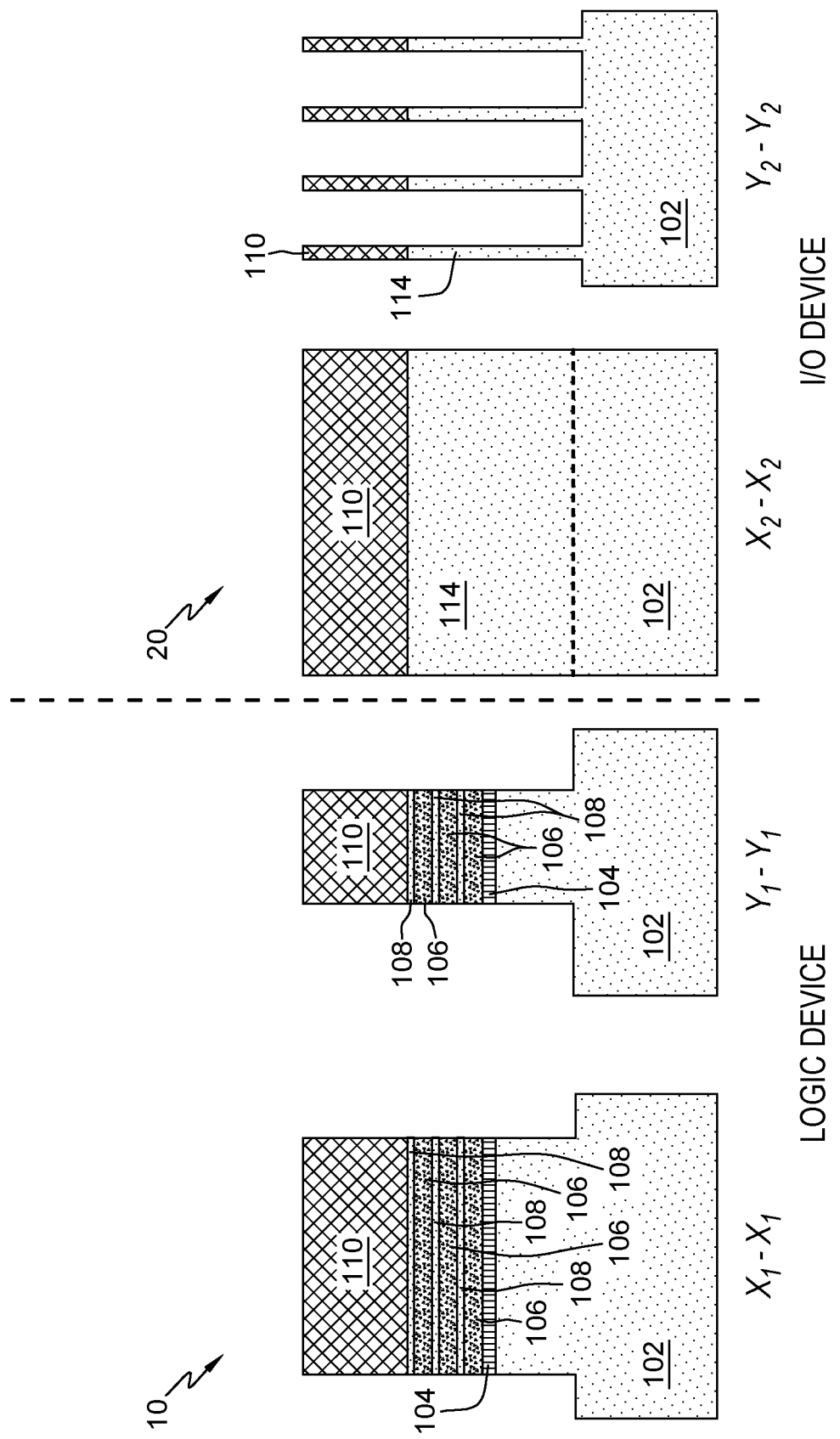
FIG. 5 is a cross section view illustrating the two structures with fins according to an exemplary embodiment.

Referring now to FIG. 5, the structures 10, 20 with fins 114 are shown, in accordance with an embodiment. The hard mask 110 is deposited on the top surfaces of the structures 10, 20. The hard mask 110 is then patterned and an anisotropic etch process such as, for example, a reactive ion etch (RIE), is used to form the fins 114 on both the structures 10, 20. Once the fins 114 are formed, the structures 10, 20 undergo additional processing to form shallow trench isolations.

Figure 6:
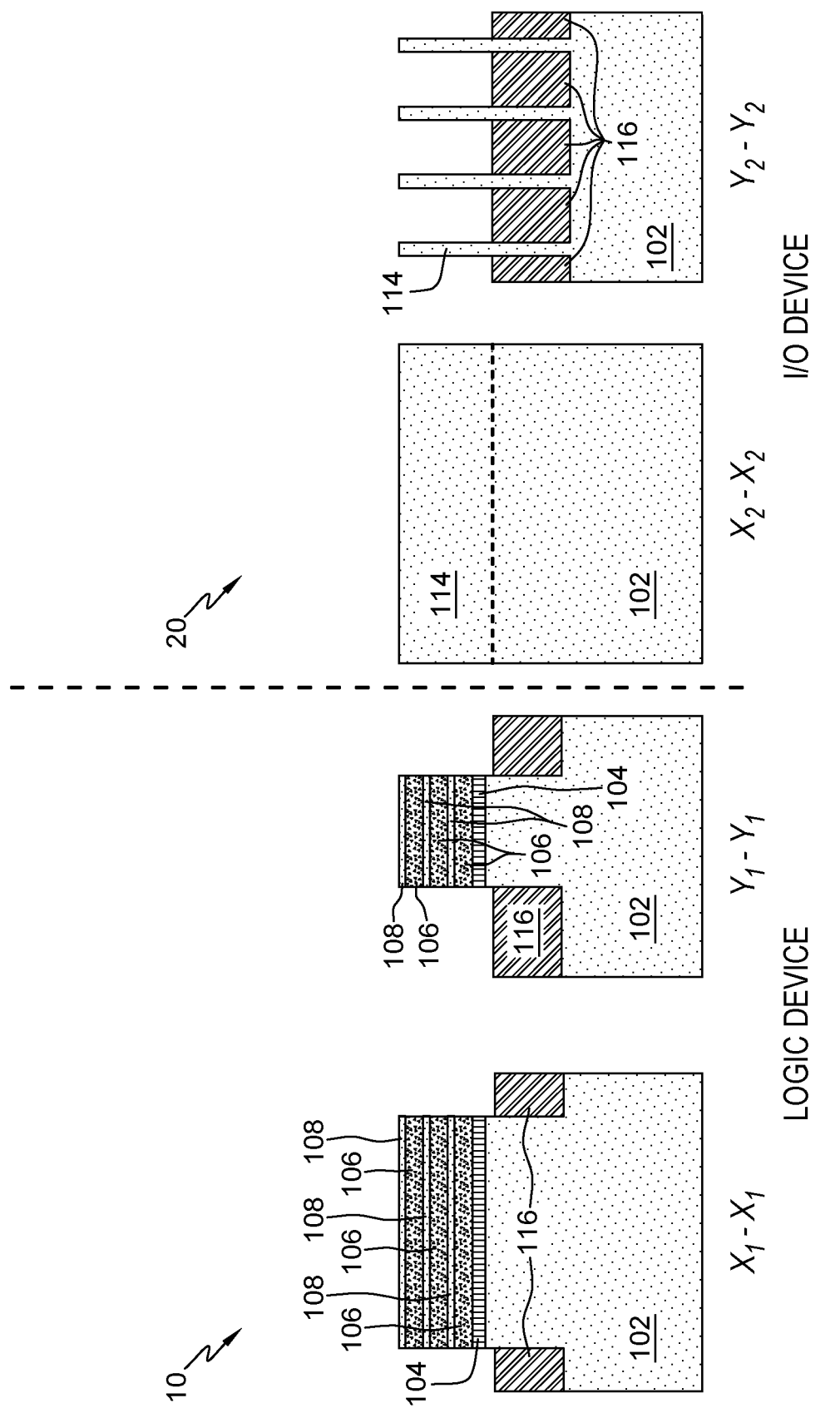
FIG. 6 is a cross section view illustrating forming shallow trench isolations between the fins and the structures according to an exemplary embodiment.

Referring now to FIG. 6, one or more shallow trench isolation (STI) regions 116 are formed of a dielectric plug that separates adjacent devices, such as, for example, adjacent devices within the structure 10 and the adjacent devices within the structure 20. For example, electrical current applied to one device within the structure 10 has no effect on the adjacent device within the structure 10. The STI regions 116 between the fins 114 within structure 20 also separate the fins 114 such that electrical current applied to one fin has no effect on the other fins.

The STI regions 116 may be made of an oxide material and may be formed by depositing an oxide material such as, for example, silicon oxide, onto the top surfaces of the structures 10, 20, followed by oxide planarization and oxide recess. The STI regions 116 within the structure 10 extends from the top surface of the substrate 102 to below the bottom surface of the first sacrificial layer 104 such that the bottom surface of the first sacrificial layer 104 is above a top surface of the STI regions 116. The STI regions 116 within the structure 20 extend from a top surface of the substrate 102 to below the top surface of the fins 114 such that the top surfaces of the STI regions 116 are below the top surfaces of the fins 114. Once the STI regions 116 are formed, the hard mask 110, illustrated in FIG. 5, may be removed from the top surfaces of the fins 114.

Figure 7:
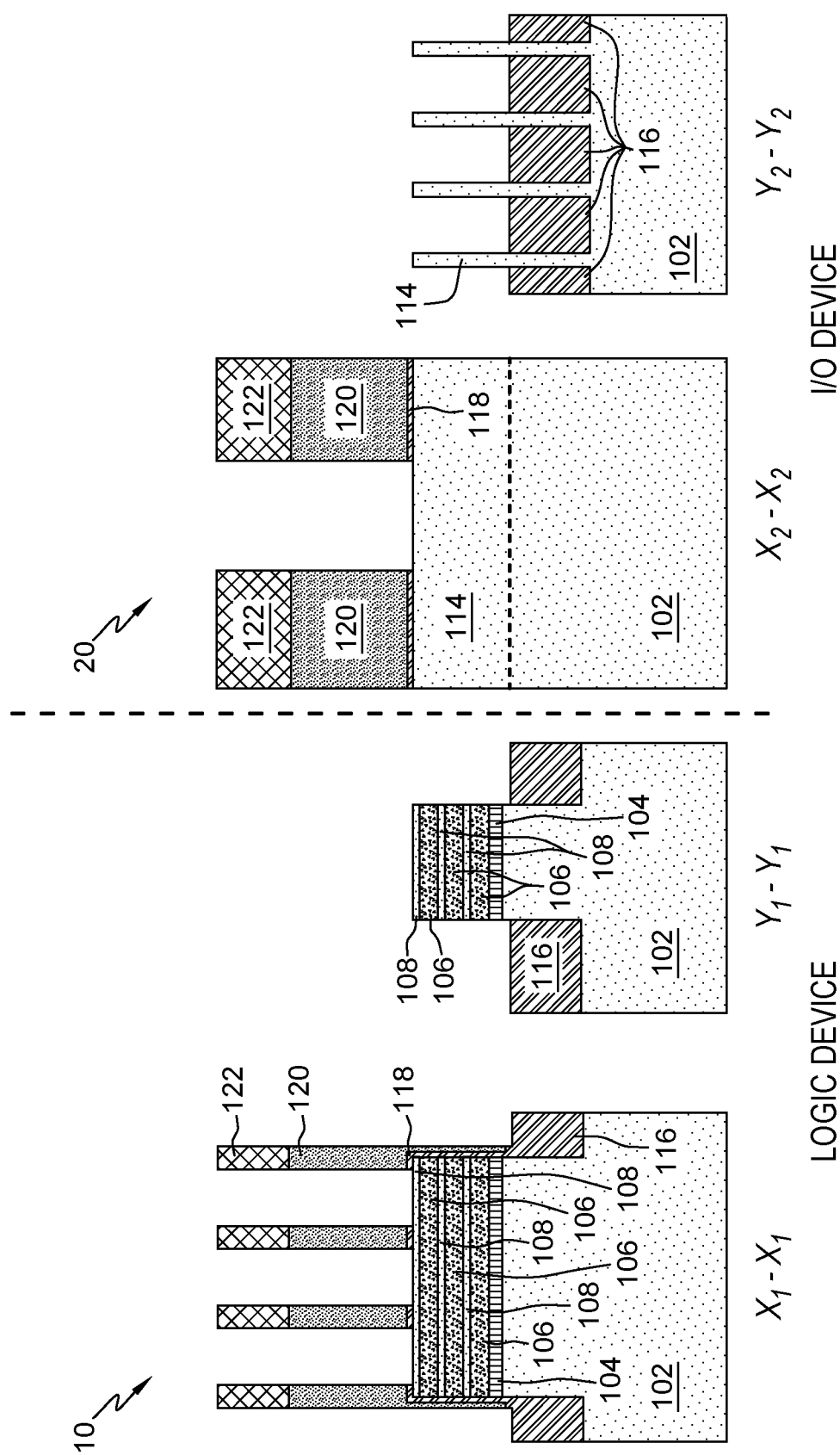
FIG. 7 is a cross section view illustrating the structures with sacrificial gates according to an exemplary embodiment.
Figure 8:
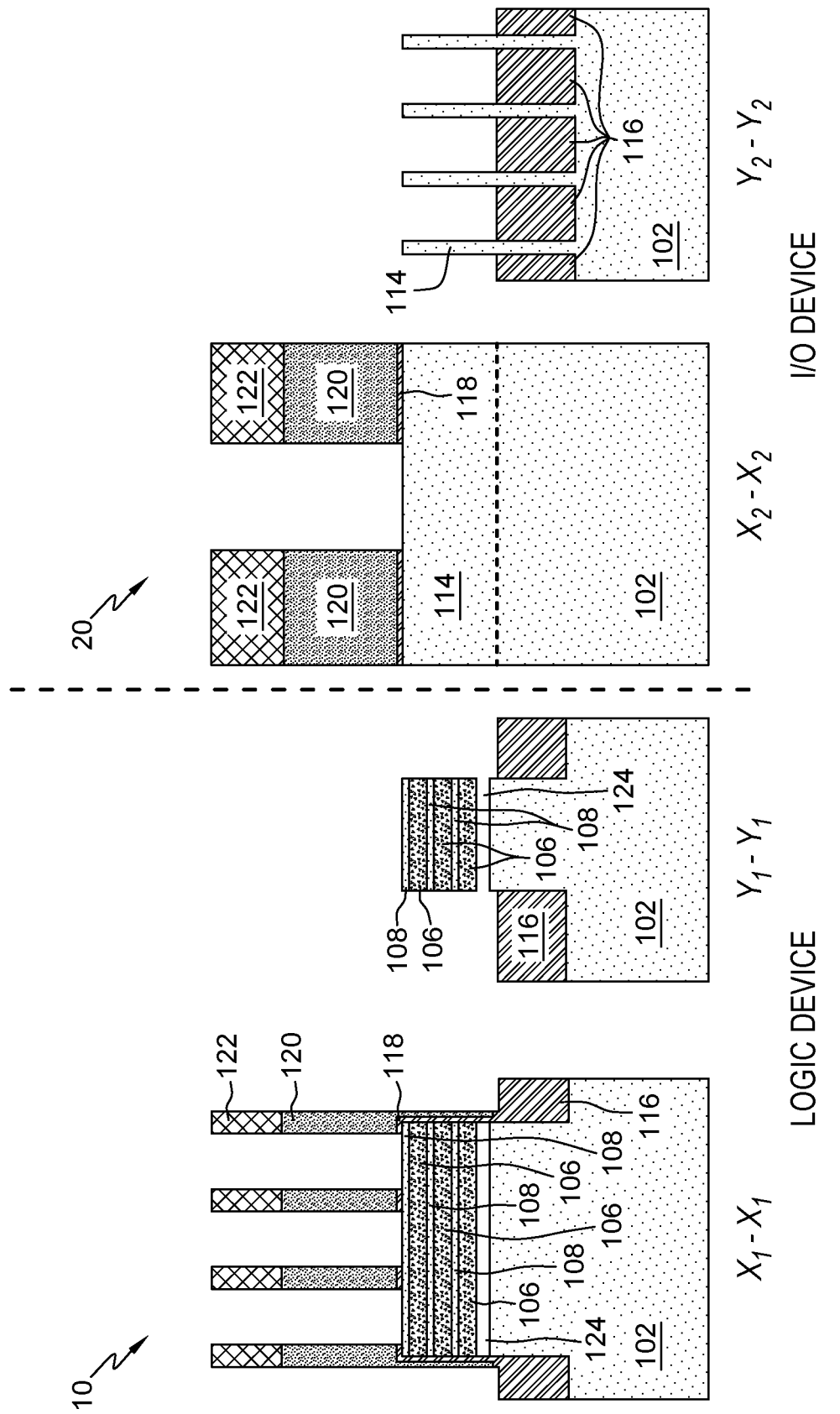
FIG. 8 is a cross section view illustrating one of the structures with an opening above the substrate according to an exemplary embodiment.

Referring now to FIG. 7, the structures 10, 20 with sacrificial gates 120 are shown, in accordance with an embodiment. A barrier 118 is first conformally deposited onto the top surfaces of the structures 10, 20 using known deposition techniques such as, for example, chemical vapor deposition (CVD) or physical vapor deposition (PVD). The barrier 118 may be made of dielectric oxides (e.g., silicon oxide), dielectric nitrides (e.g., silicon nitride), dielectric oxynitrides, or any combination thereof. The sacrificial gates 120 are then formed on top of the barrier 118.

The sacrificial gates 120 may be formed by first depositing a sacrificial gate material, such as, for example, amorphous silicon (α-Si) or polycrystalline silicon (polysilicon). The sacrificial material may be deposited by a deposition process, including, but not limited to, PVD or CVD. A hard mask is then deposited on top of the sacrificial gate material and patterned. An anisotropic etch process such as, for example, a RIE process may be used to form the sacrificial gates 120. The sacrificial gates 120 are covered by a hard mask cap 122. The hard mask cap 122 may include one or more dielectric materials, such as a layered combination of silicon dioxide and silicon nitride.

The sacrificial gates 120 may have a spaced-apart arrangement along the length of the epitaxy stack 200 and may be aligned transverse to the epitaxy stack 200. Once the sacrificial gates 120 are formed, the first sacrificial layer 104 is selectively removed from the structure 10 to create an opening 124, illustrated in FIG. 8. An etch process is used to remove the first sacrificial layer 104 selective to the second sacrificial layers 106 and the nanosheet channel layers 108. Since the concentration of germanium in the first sacrificial layer 104 is higher than the concentration of germanium in the second sacrificial layer 106, the first sacrificial layer 104 may be selectively removed without also removing any of the second sacrificial layers 106 within the structure 10. Since the structure 20 does not include the first sacrificial layer 104, no layers are removed during the selective removal of the first sacrificial layer 104 from the structure 10.

The opening 124 is then filled with a dielectric material such as, for example, silicon dioxide, silicon nitride, or a low-k dielectric such as SiBCN, SiOC, and SiOCN to form an isolation layer 126 which may be referred to as a bottom isolation layer. The isolation layer 126 is formed on the top surface of the substrate 102 and is in direct contact with a bottom surface of the bottom most second sacrificial layer 106. In an embodiment, the isolation layer 126 separates the substrate 102 from the gate region and provides an electrical disconnect such that the gate region is electrically isolated from the substrate 102. In an alternative embodiment, the isolation layer 126 separates the substrate 102 from a source/drain region of a FET and provides an electrical disconnect such that the source/drain region is electrically isolated from the substrate 102. In yet another embodiment, the isolation layer 126 isolates both the source/drain region and the gate region from the substrate 102.

Figure 9:
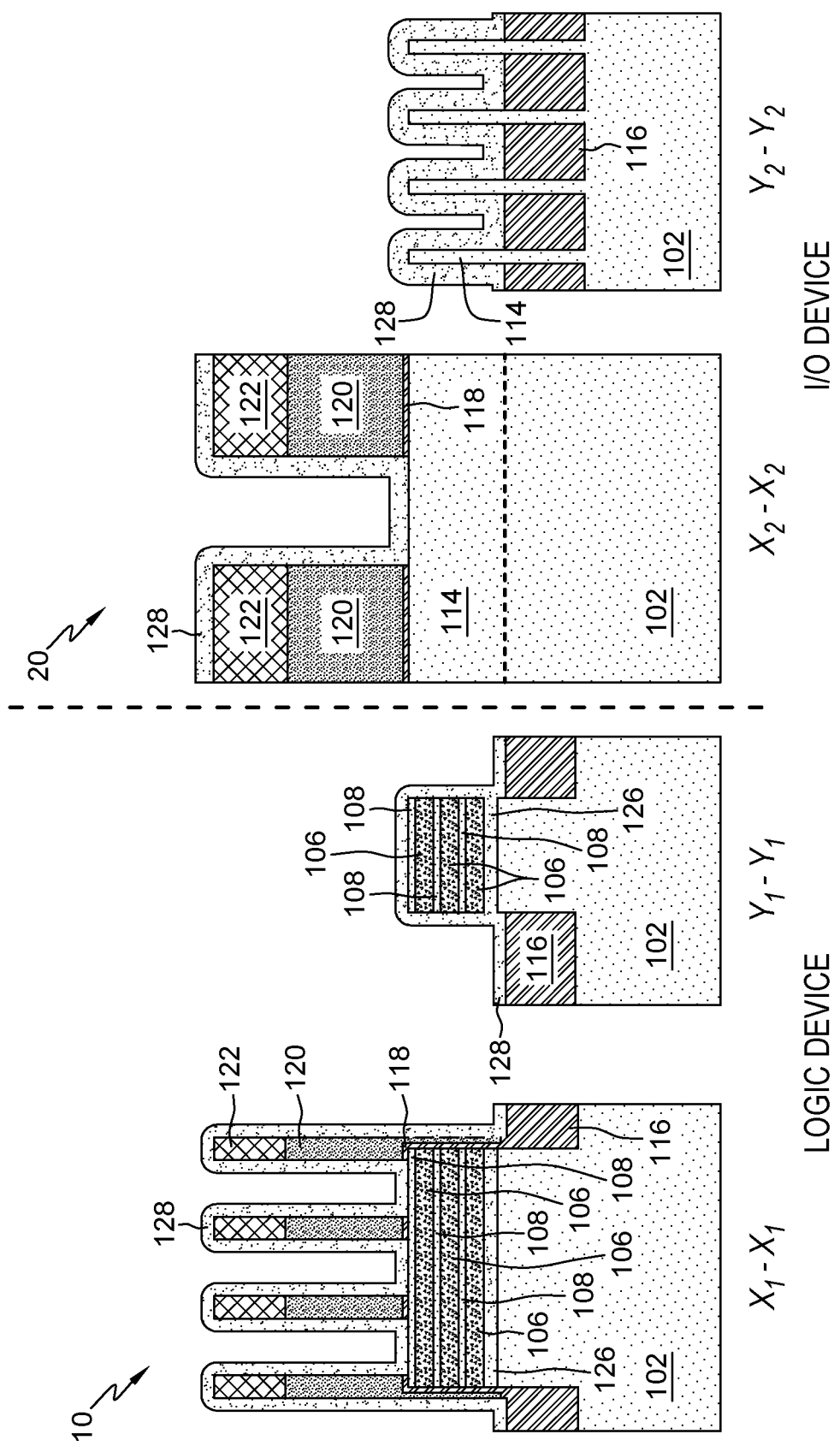
FIG. 9 is a cross section view illustrating the two structures with gate spacers around the sacrificial gates according to an exemplary embodiment.

In addition to the formation of the isolation layer 126, a gate spacer 128 is formed on the top surfaces of the structures 10, 20, illustrated in FIG. 9. That is, the isolation layer 126 and the gate spacer 128 are formed simultaneously using the same conformal deposition of dielectric. The gate spacer 128 may be made of silicon dioxide, silicon nitride, or a low-k dielectric such as SiBCN, SiOC, and SiOCN. The gate spacer 128 is formed at the sidewalls of the sacrificial gates 120 and cover the hard mask cap 122.

Figure 10:
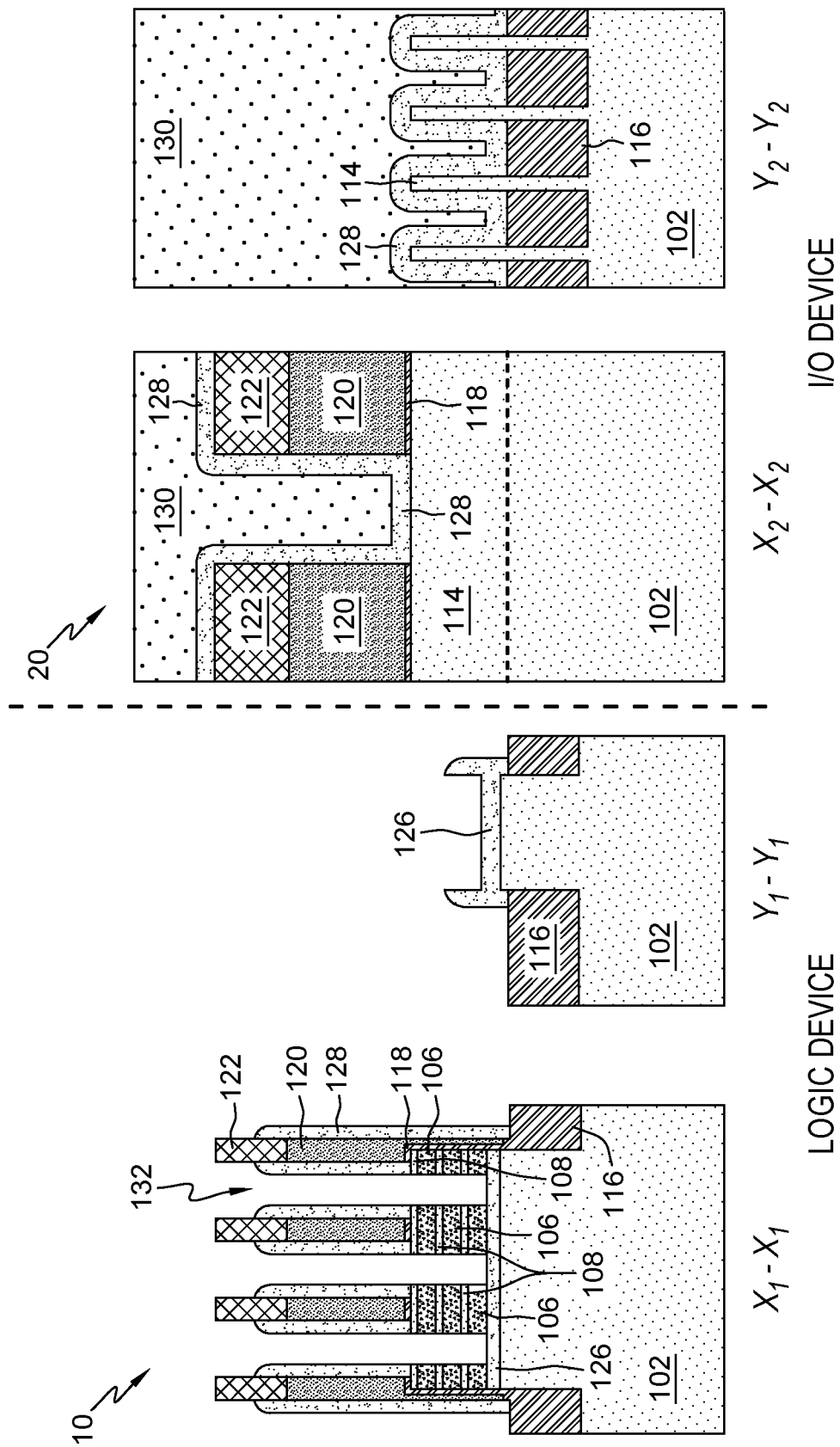
FIG. 10 is a cross section view illustrating one of the structures with portions of the epitaxy stack between the sacrificial gates removed according to an exemplary embodiment.
Figure 11:
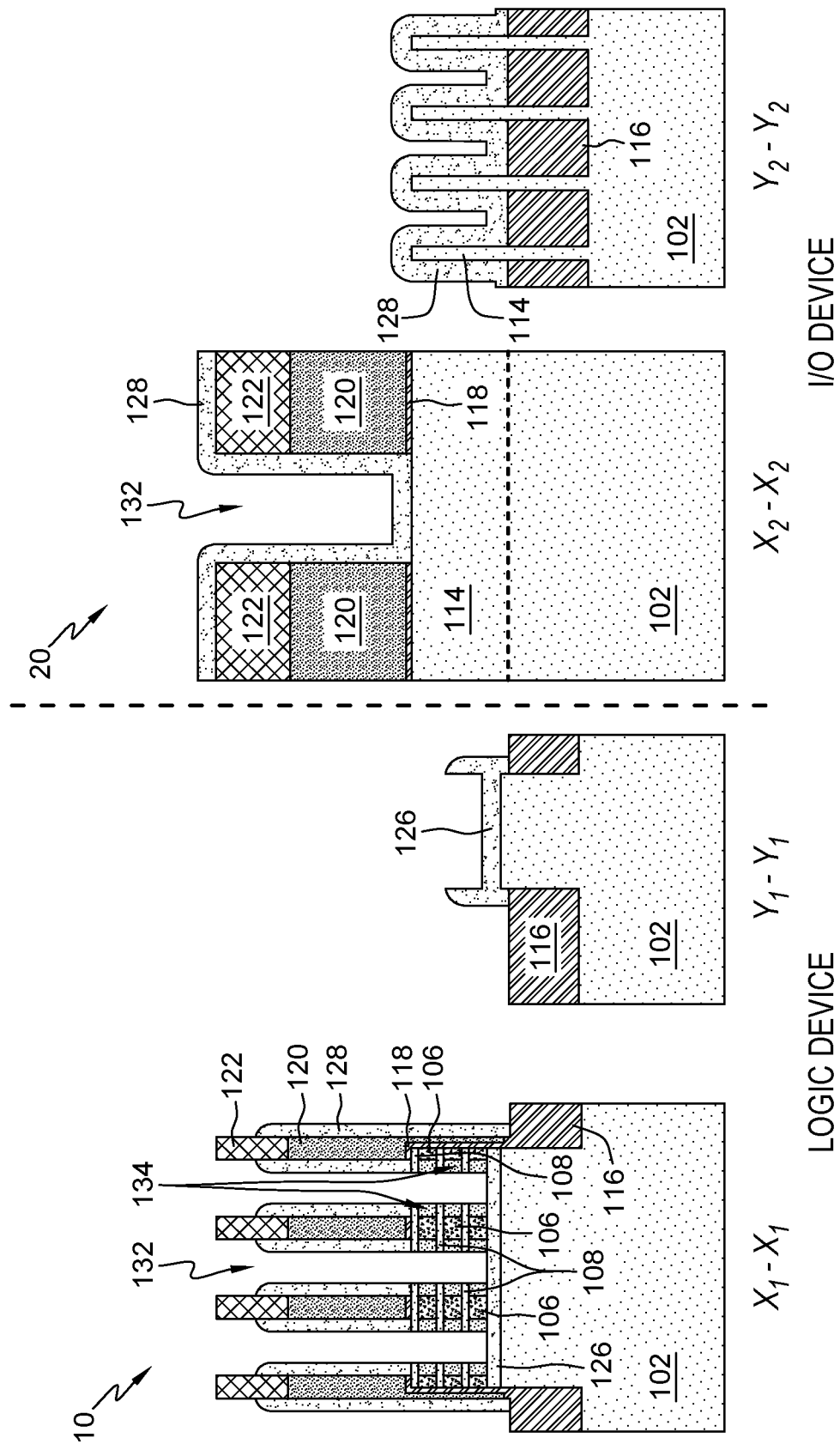
FIG. 11 is a cross section view illustrating one of the structures with inner spacers formed between nanosheet channel layers according to an exemplary embodiment.

After the gate spacer 128 is formed, an organic planarization layer (OPL) 130 is deposited on top of the structures 10, 20. The OPL 130 is then patterned such that the OPL 130 remains on top of the structure 20. The OPL 130 is removed from the top surface of the structure 10. The structure 10 undergoes a self-aligned etching process during which the sacrificial gates 120 operate as an etch mask. The self-aligned etching, which may be an anisotropic RIE process, may utilize one or more etch chemistries to etch the gate spacer 128 and epitaxy stack 200. The etching process completely removes the portions of the gate spacer 128 and the epitaxy stack 200 between the sacrificial gates 120, as is illustrated in FIG. 10, and creates gaps 132. The gaps 132 extend from an exposed top surface of the hard mask cap 122 to the exposed top surface of the isolation layer 126. In addition, the etching process removes portions of the gate spacer 128 from around the top portions of the sidewalls of the hard mask cap 122 as well as from a top surface of the STI regions 116. However, the gate spacer 128 on the structure 20 remains intact because it is protected by the OPL 130. The resultant structure 10, illustrated in FIG. 10, includes the gate spacers 128 on the sidewalls of the sacrificial gates 120 such that the outside sidewalls of the gate spacers 128 are substantially flush with the sidewalls of the epitaxy stack 200.

Once the gaps 132 between the sacrificial gates 120 are formed, the OPL 130 is removed from the top surface of the structure 20. Using a dry or wet isotropic etching process, the second sacrificial layers 106 are then laterally recessed, selective to the nanosheet channel layers 108. Since the nanosheet channel layers 108 are not recessed, the lateral recessing of the second sacrificial layers 106 forms indents between these nanosheet channel layers 108. The indents extend laterally the width of the gate spacer 128 (i.e. the indents extend laterally from the inner sidewall to the outer sidewall of the gate spacer 128). The indents are then filled by pinch-off mechanism, using a deposition process such as ALD, with a dielectric material, such as silicon nitride or any other low-k dielectric material, to form inner spacers 134, illustrated in FIG. 11.

Figure 12:
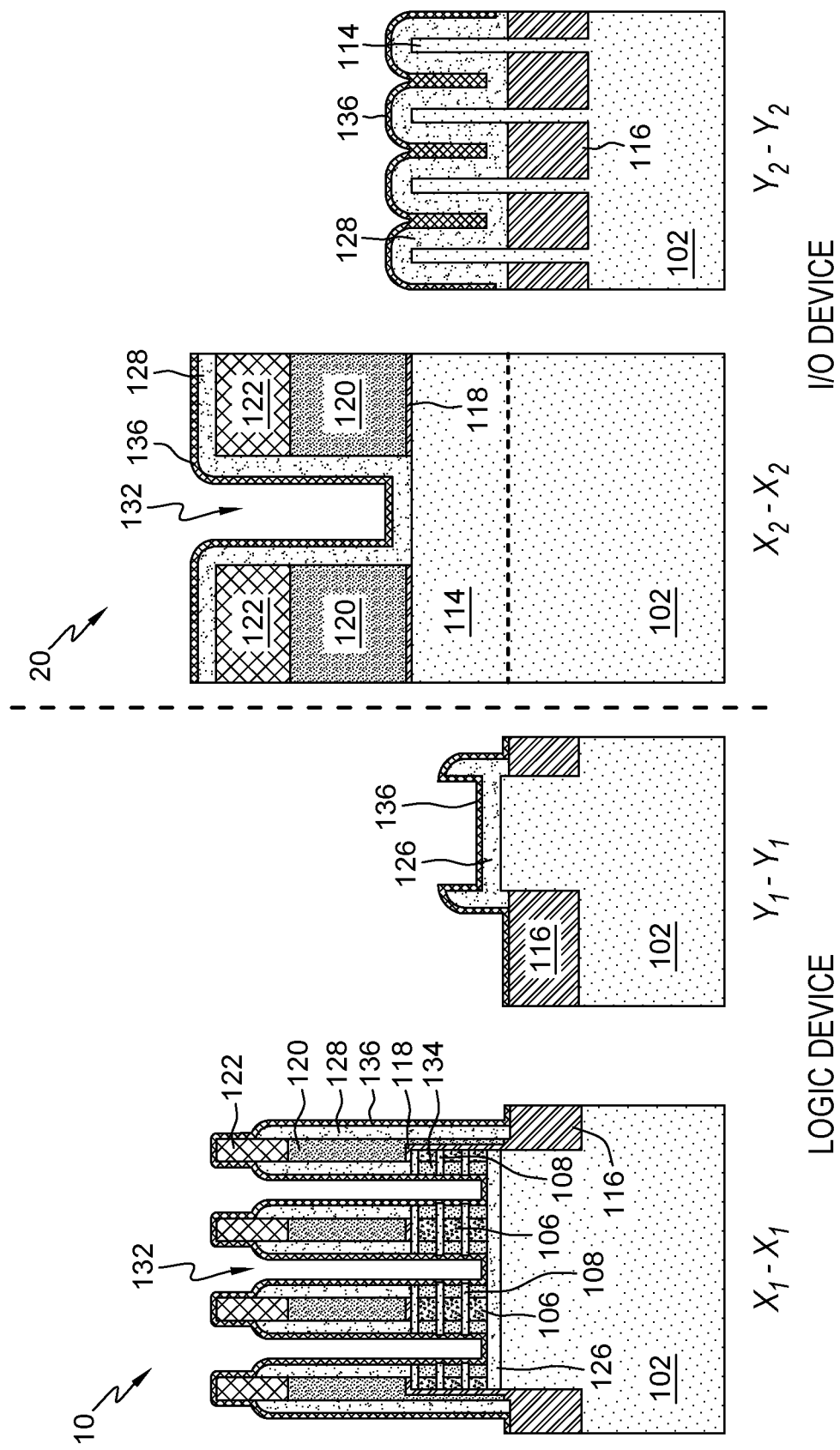
FIG. 12 is a cross section view illustrating both structures with a liner deposited on top of the gate spacers according to an exemplary embodiment.

An isotropic etch process may then be used to remove any dielectric material remaining such that the dielectric material only remains within the indents. The structures 10, 20 undergo further processing during which a liner 136, illustrated in FIG. 12, is conformally deposited, using known deposition techniques, onto the structures 10, 20. The liner 136 may be made of silicon nitride.

Figure 13:
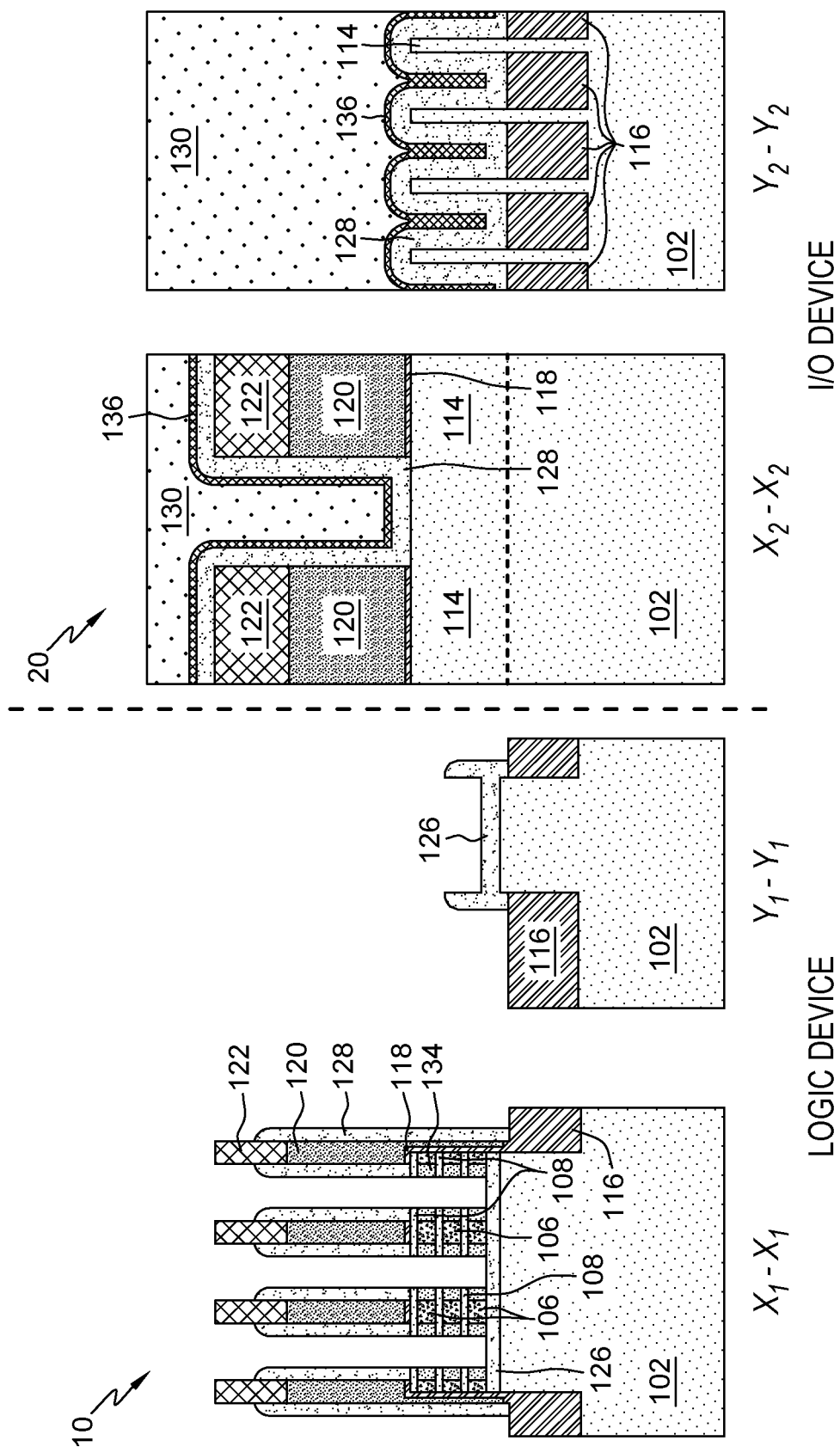
FIG. 13 is a cross section view illustrating one of the structures with the liner removed from its surface according to an exemplary embodiment.

Referring now to FIG. 13, the OPL 130 on the structure 20 is shown, in accordance with an embodiment. After the conformal deposition of the liner 136, the OPL 130 is deposited onto the top of the structures 10, 20. The OPL 130 is then patterned such that the OPL 130 remains on top of the structure 20 protecting the structure 20 from damage during further processing. The OPL 130 is removed from the structure 10, exposing the top surface of the liner 136. The liner 136 is removed, using an etch process, to expose the sidewalls of the hard mask cap 122 and the sidewalls of the gate spacers 128. In addition, the top surface of the isolation layer 126 and the top surface of the STI regions 116 are also exposed. The OPL 130 is then removed from the structure 20 to expose the top surface of the structure 20.

Figure 14:
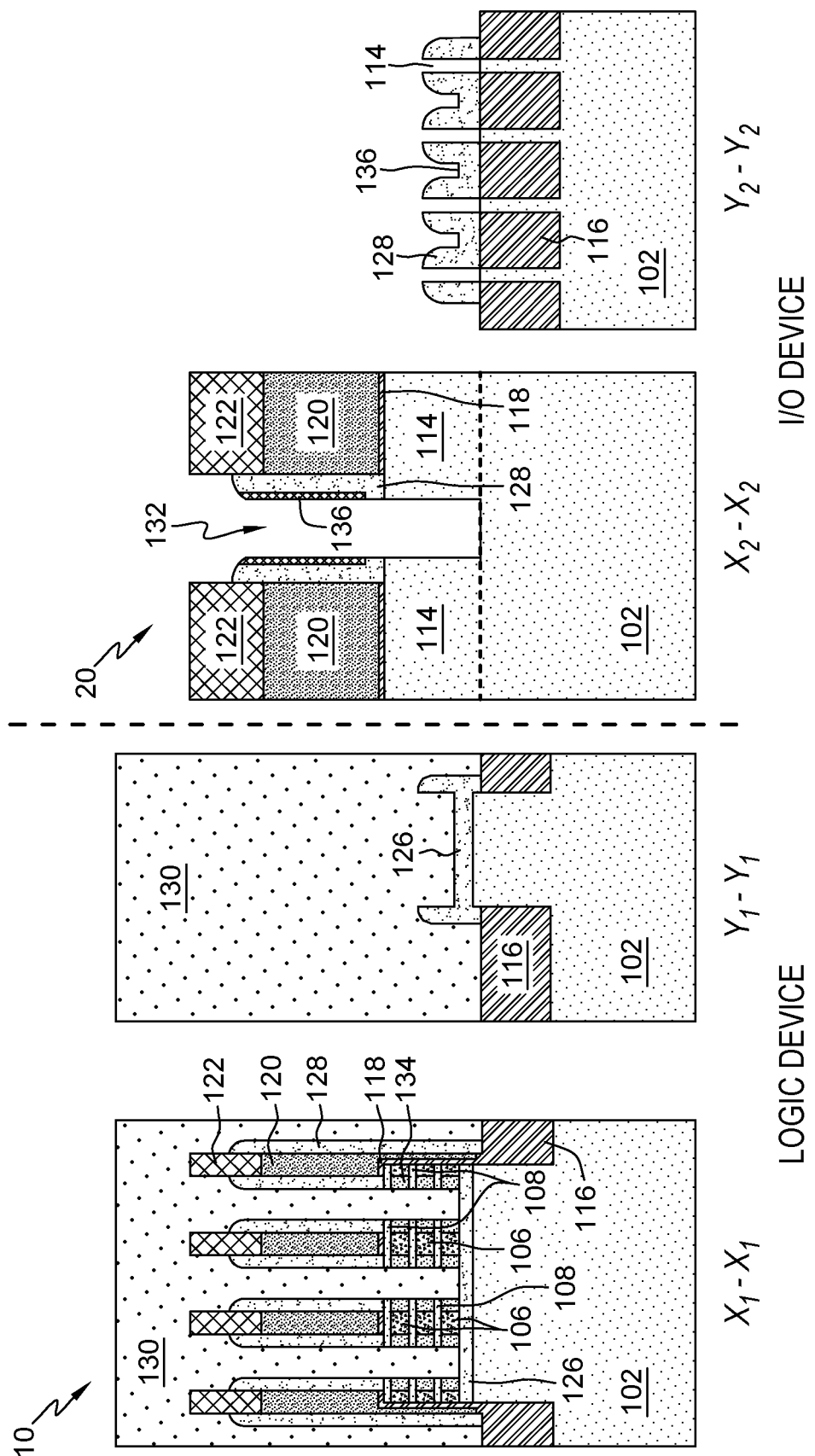
FIG. 14 is a cross section view illustrating one of the structures with an organic planarization layer on its surface according to an exemplary embodiment.

The structures 10, 20 undergo another patterning step. First, the OPL 130 is deposited on top of the structures 10, 20. The OPL 130 is then subsequently patterned and removed from the top surface of the structure 20. As a result, the OPL 130 remains on top of the structure 10, as illustrated in FIG. 14. An anisotropic etch process is then performed to selectively recess the liner 136, the gate spacer 128 and silicon epitaxy layer 112 from the structure 20 to expose the top surface of the substrate 102. During the etch process, the horizontal portions of the liner 136 and the gate spacer 128 are removed such that the top surface and the top portions of the sidewalls of the hard mask cap 122 are exposed. The resultant structure 20 includes portions of the liner 136 at the sidewalls of the gate spacer 128, within the gap 132. In addition, the outside sidewalls of the liner 136 are substantially flush with the sidewalls of the silicon epitaxy layer 112. The OPL 130 on the structure 10 is then removed to expose the top surface of the structure 10.

Figure 15:
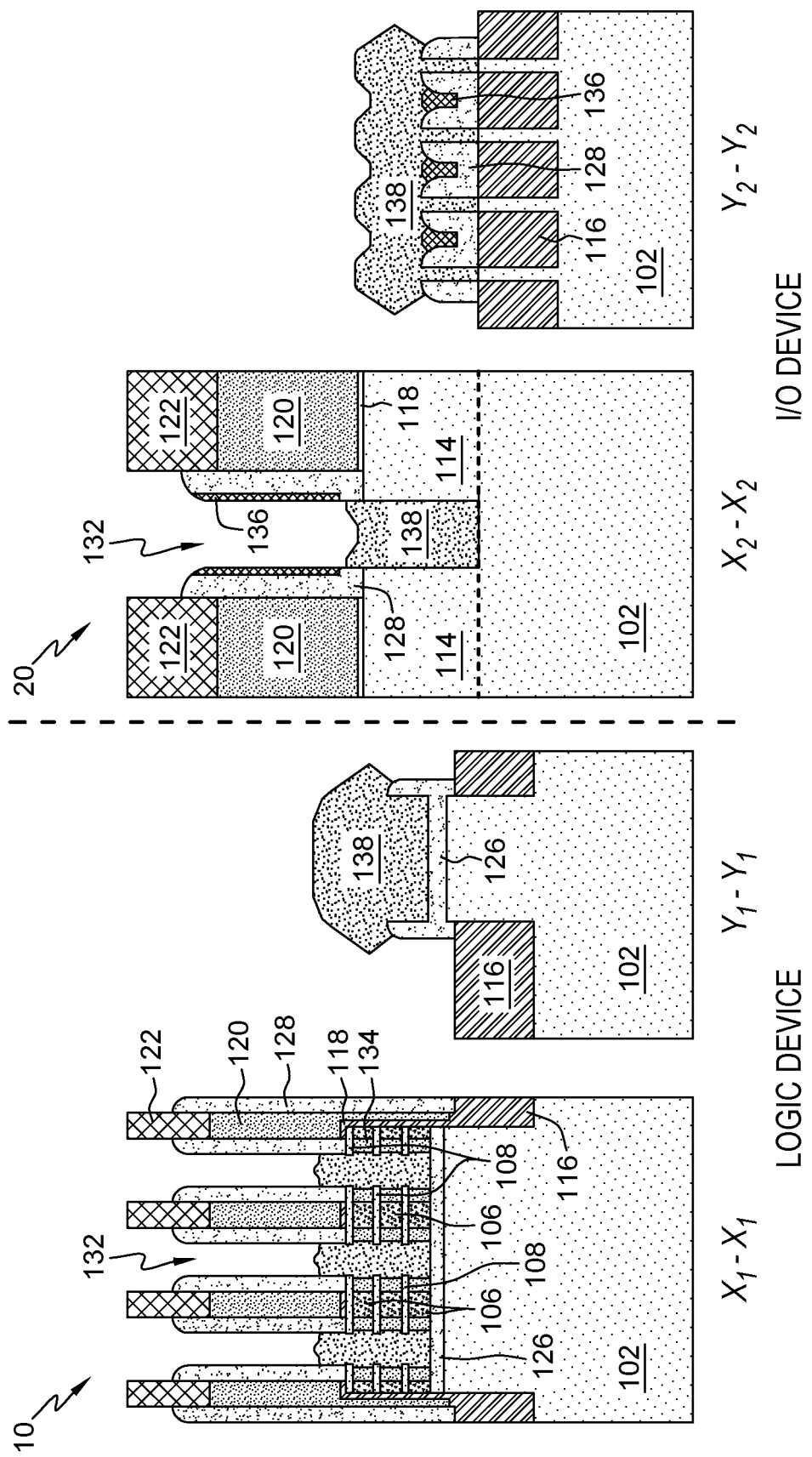
FIG. 15 is a cross section view illustrating both figures with source drain epitaxy formed between the sacrificial gates according to an exemplary embodiment.

Referring now to FIG. 15, a source drain epitaxy 138 is grown within the gaps 132. The source drain epitaxy 138 grows simultaneously on both the structure 10 and the structure 20. The source drain epitaxy 138 on the structure 10 extends from the top surface of the isolation layer 126 to the bottom portions of the sacrificial gates 120. A top surface of the source drain epitaxy 138 is above the top-most nanosheet channel layer 108 of the structure 10. The source drain epitaxy 138 on the structure 20 extends from the top surface of the substrate 102 to the bottom portions of the gate spacer 128.

Figure 16:
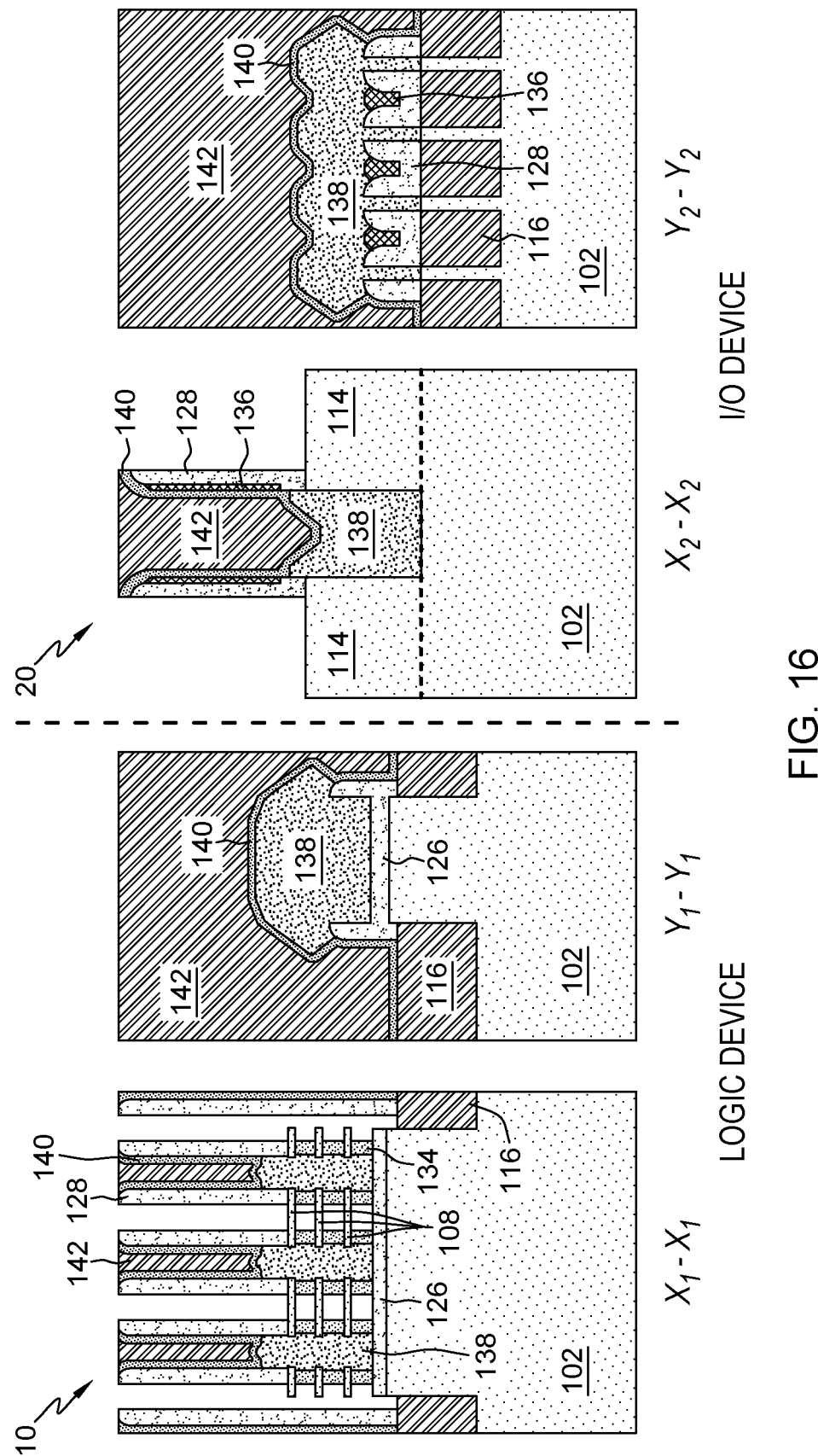
FIG. 16 is a cross section view illustrating the two structures with a first interlayer dielectric deposited on top of the source drain epitaxy according to an exemplary embodiment.

Referring now to FIG. 16, an etch stop liner 140 is conformally deposited on top of the structures 10, 20 using known deposition techniques. The etch stop liner 140 covers the top surface of the source drain epitaxy 138 as well as the sidewalls of the gate spacers 134. The etch stop liner 140 may be made of silicon nitride. The etch stop liner 140 is used to protect the epitaxy 138 during the subsequent formation of the metal contacts 152. After the conformal deposition of the etch stop liner 140, the structures 10, 20 undergo further processing where an interlayer dielectric (ILD) 142 is deposited on top of the etch stop liner 140 within the gaps 132 (which were illustrated in FIG. 15). The ILD 142 may be composed of a dielectric material, such as silicon dioxide. Once deposited, the structures 10, 20 may undergo a planarization process, such as chemical mechanical polishing (CMP), during which the hard mask cap 122 may be removed to expose top surfaces of the sacrificial gates 120.

Having the top surface of the sacrificial gates 120 exposed allows for the sacrificial gates 120 and the barrier 118 to be selectively removed with one or more etching processes. In addition, a plurality of the second sacrificial layers 106 are also removed with an etching process that removes the material of the second sacrificial layers 106 (i.e. silicon germanium with a germanium concentration range of about 15% to about 35%) selective to the materials of the nanosheet channel layers 108 and inner spacers 134. By removing the second sacrificial layers 106, a plurality of spaces 144 surrounding the nanosheet channel layers 108 are created. The nanosheet channel layers 108, within the structure 10, are anchored at opposite ends by the inner spacers 134.

Figure 17:
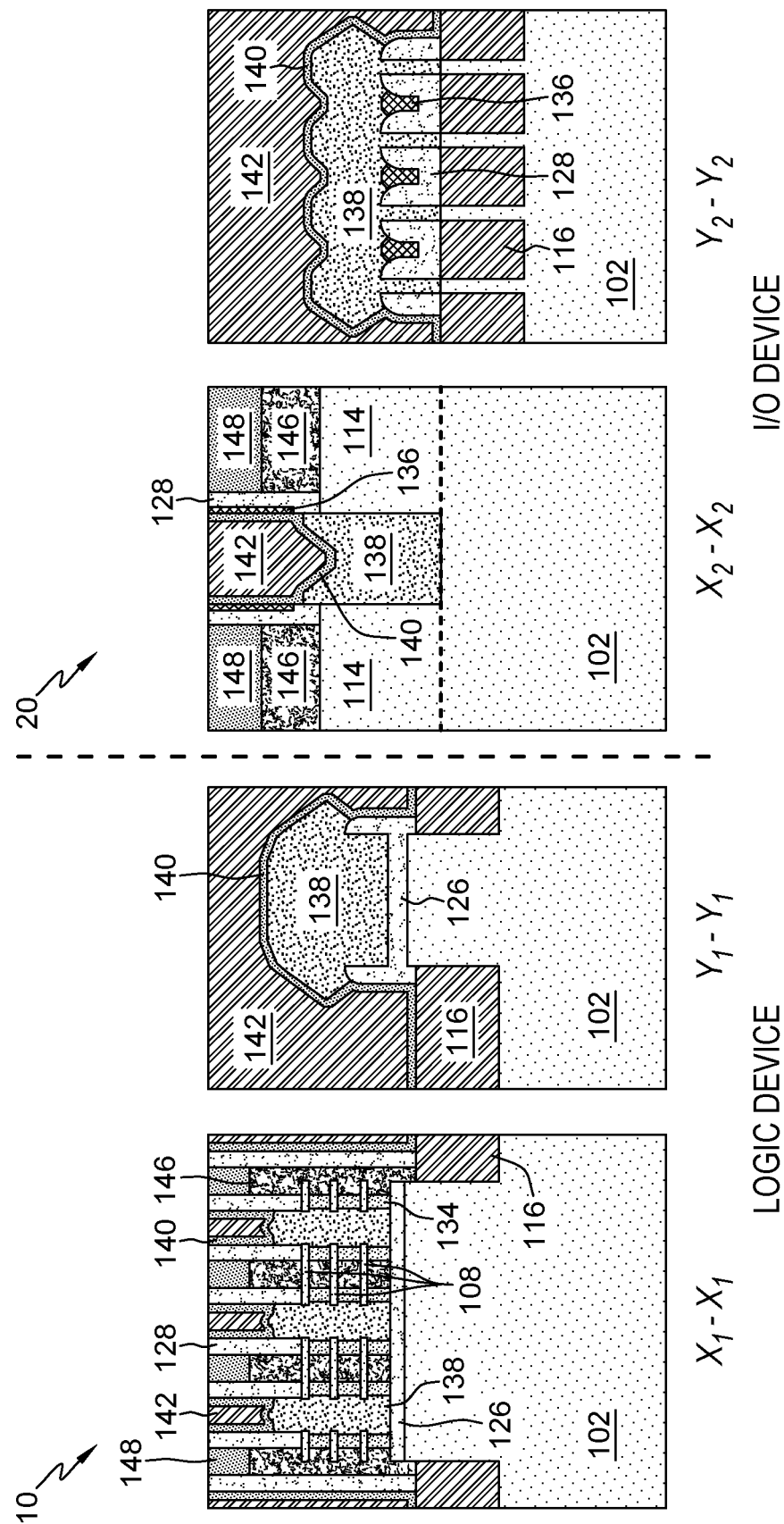
FIG. 17 is a top view illustrating the two structures with metal gates formed between the source drain epitaxy according to an exemplary embodiment.

Referring now to FIG. 17, after removing the sacrificial gates 120 and the second sacrificial layers 106, the structures 10, 20 undergo a replacement gate process to form metal gate stacks 146. Portions of the metal gate stacks 146, within the structure 10, are formed in the spaces 144 (illustrated in FIG. 16) formerly occupied by the removed second sacrificial layers 106. These portions of the metal gate stacks 146 surround respective exterior surfaces of the nanosheet channel layers 108 in a gate-all-around (GAA) arrangement. In an embodiment, the gate dielectric that makes up the metal gate stack stacks 146 within the structure 10 is different than the gate dielectric that makes up the metal gate stacks 146 within the structure 20. For example, the metal gate stacks 146 within the structure 10 may be made of high-k gate dielectrics, such as $HfO_2$, and the gate dielectric that makes up the metal gate stack stacks 146 within the structure 20 may be made of a thicker oxide dielectric, such as silicon oxide ($SiO_2$). As a result, the gate dielectric within the structure 20 is thicker than the gate dielectric within the structure 10. In an alternative embodiment, the gate dielectric within the structure 20 is thinner than the gate dielectric within the structure 10. Once the metal gate stack stacks 146 are formed, self-aligned contact caps 148 are formed in the spaces between the gate spacers 128 over each of the metal gate stacks 146. The self-aligned contact caps 148 may be made of a dielectric material, such as silicon nitride.

Figure 18:
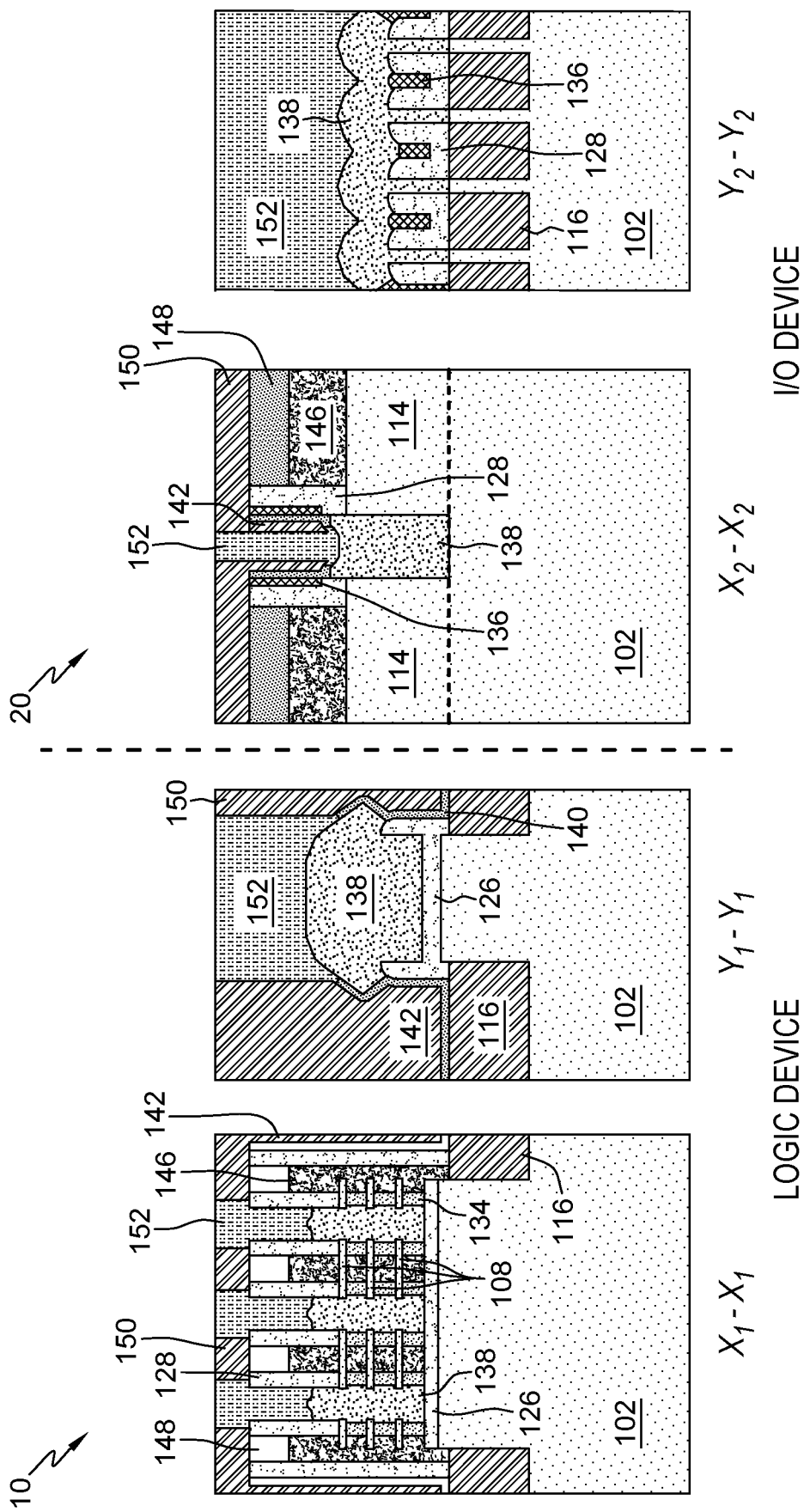
FIG. 18 is a top view illustrating the structures with metal contacts formed on top of each source drain epitaxy according to an exemplary embodiment.

Referring now to FIG. 18, the structures 10, 20 with metal contacts 152 are shown, in accordance with an embodiment. After the formation of the self-aligned contact caps 148 over each of the metal gate stacks 146 on the structures 10, 20, a second ILD 150 is deposited and planarized by CMP. The second ILD 150 may be made of substantially the same material that the first ILD 142 is made of. The second ILD 150 covers the top surfaces of the structures 10, 20. An anisotropic etch process is then used to etch the first and second ILD 142, 150 and land selectively on the etch stop liner 140. After which, a directional RIE, with different chemistry, is used to remove the etch stop liner 140 selectively to the first ILD 142 and the source drain epitaxy 138. The two etch processes form contact openings that are filled to form the metal contacts 152. The contact openings may first be conformally lined with a metal liner made of material, such as titanium, titanium nitride, or combination thereof. The contact openings may then be filled to form the metal contacts 152. The metal contacts 152 may be composed of metal, such as tungsten or cobalt, and extend vertically from a top surface of the second ILD 150 to the source drain epitaxy 138, within the structures 10, 20. After the metal contacts 152 are formed they are planarized by CMP.

Figure 19:
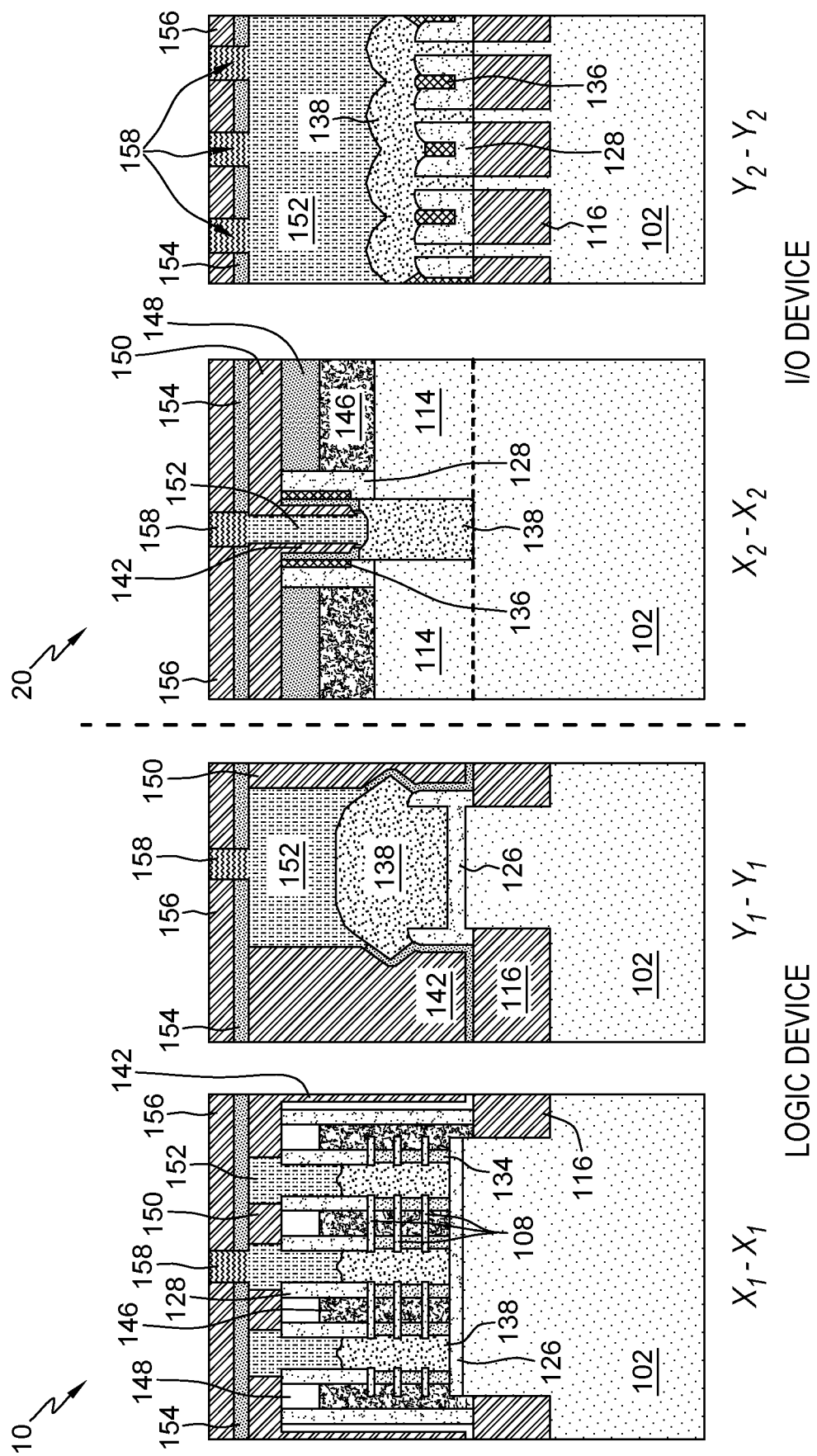
FIG. 19 is a top view illustrating the two structures with middle of the line contacts formed on top of the metal contacts according to an exemplary embodiment.

Referring now to FIG. 19, the structures 10, 20 with middle of the line (MOL) contacts 158 are shown, in accordance with an embodiment. A contact cap layer 154 is first deposited, using known deposition techniques, on top of structures 10, 20. The contact cap layer 154 may be made of a dielectric material, such as silicon nitride. A third ILD 156 is deposited on top of the contact cap layer 154. The third ILD 156 may be made of substantially the same material as the first ILD 142 and the second ILD 150. The structure 10, 20 undergo a contact patterning, etch, metallization, and metal planarization processes to form the MOL contacts 158. The MOL contacts 158 may be formed within contact trenches. The contact trenches may be first conformally lined with a metal liner made of titanium, titanium nitride or combination thereof and then filled with a metal to form the MOL contacts 158. The MOL contacts 158 may be composed of metal, such as tungsten, tungsten carbide, or cobalt. The MOL contacts 158 extend from a top surface of the third ILD 156, through the contact cap layer 154, to the top surfaces of the metal contacts 152.

The resultant structures 10, 20, as illustrated in FIG. 19, are fabricated on the same semiconductor chip, utilizing the method steps described herein with respect to FIGS. 1-19. The structure 10 is a logic device which may be a GAA nanosheet device, and the structure 20 is an I/O device which may be a FinFET. The resultant structure 10 includes the isolation layer 126 that separates the source drain epitaxy 138, the metal gate stack 146, or both, from the substrate 102. This isolation layer 126 is not present in the structure 20. Typically, a logic device (structure 10) has a much shorter gate length (12-15 nm) when compared to the gate length (100-150 nm) of the I/O device (structure 20). The main role of the isolation layer 126 is to disconnect the logic device from the substrate 102 to prevent parasitic current leakage between the source and the drain of the device. The current leakage may increase as the gate length decreases. Since the logic device has a short gate length, the isolation layer 126 may prevent the current leakage. Since the I/O device has a longer gate length, the I/O device does not require the isolation layer 126 to meet the electric target specifications.

In an embodiment, the structures 10, 20 may have different gate spacer 128 thicknesses. For example, the thickness of the gate spacer 128 in the structure 20 may be larger than the thickness of the gate spacer 128 in the structure 10. The structure 20 may require a relatively thicker gate spacer 128 because the structure 20 may operate at a higher voltage than the structure 10. For example, the structure 10 may operate at 0.7V and the structure 20 may operate at 1.5V. As a result, the structure 10 may have the gate spacer 128 thickness range from about 4 nm to about 10 nm and the structure 20 may have the gate spacer 128 about 1 nm to about 3 nm thicker than the gate spacer 128 in the structure 10. Having a thicker gate spacer 128 allows for the structure 20 to meet its specific voltage reliability requirements. In another embodiment, the gate spacer 128 in the structure 20 may be thinner than the gate spacer 128 in the structure 10. In an alternative embodiment, the structures 10, 20 may have the same gate spacer 128 thickness.

In an embodiment, the structures 10, 20 may have different gate dielectric thicknesses. For example, the structure 10 may exhibit thicker or thinner gate dielectric when compared to the structure 20. For example, the structure 10 may have a gate dielectric thickness range from about 1.5 nm to about 3 nm, and the structure 20 may have a gate dielectric thickness range from about 2.5 nm to about 5 nm. Typically, the gate dielectric within the structure 20 is thicker than the gate dielectric within the structure 10 in order to handle higher voltage operation of the structure 20.

In an embodiment, both the GAA nanosheet (structure 10) and the FinFET (structure 20) may be a p-type FET or an n-type FET. For example, during the manufacturing of the GAA nanosheet and the FinFET, the substrate 102 and the source drain epitaxy 138 may be doped with a dopant, which may be an n-type dopant or a p-type dopant. If the substrate 102 is doped with a p-type dopant and the source drain epitaxy 138 is doped with an n-type dopant, then the resultant structures 10, 20 may be an nFET GAA nanosheet and an n-type FinFET, respectively. If the substrate 102 is doped with an n-type dopant and the source drain epitaxy 138 is doped with a p-type dopant, then the resultant structures 10, 20 may be a pFET GAA nanosheet and a p-type FinFET, respectively. It should be appreciated that if the resultant structure 10 is an n-FET GAA nanosheet, then the process described herein with reference to FIGS. 1-19 may be repeated to form a p-FET GAA nanosheet. Likewise, if the resultant structure 20 is an n-type FinFET, then the process described herein with reference to FIGS. 1-19 may be repeated to form a p-type FinFET. It should be appreciated that embodiments of the present invention may include the structures 10, 20 to be nFET GAA nanosheet and a pFET finFET, respectively, and pFET GAA nanosheet and an nFET finFET, respectively. This may be accomplished by adjusting the doping and polarities of the source drain epitaxy 138 in the structures 10, 20.

In an embodiment, the logic device (structure 10) may be a p-FET or an n-FET, where the p-FET is a GAA nanosheet and the n-FET is a Fin device, and the I/O device (structure 20) is a Fin device. Alternatively, the logic device (structure 10) may be a p-type FinFET and an n-FET GAA nanosheet, and the I/O device (structure 20) is a Fin device. As a result, the logic device may have an nFET GAA nanosheet and a p-type FinFET. Further, following the same integration, described herein with respect to FIGS. 1-19, embodiments of the present invention provide a logic region that may include a nanosheet structure with the isolation layer 126 and a FinFET without the isolation layer 126.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure, comprising:
   a nanosheet field-effect transistor located on a first portion of a substrate, wherein a source drain of the nanosheet field-effect transistor is separated from the substrate by an isolation layer, wherein a gate of the nanosheet field-effect transistor is separated from the substrate by the isolation layer; and
   a fin field-effect transistor located on a second portion of the substrate, wherein a source drain of the fin field-effect transistor is in direct contact with the substrate, wherein the source drain of the fin field-effect transistor includes a first portion and a plurality of second portions that extend off the first portion, wherein each of the plurality of second portions and the first portion have different dimensions, wherein the second portion is in contact with the substate, and wherein a gate of the fin field-effect transistor is in direct contact with a fin of the fin field-effect transistor.

2. The semiconductor structure of claim 1, further comprising:
   a gate spacer surrounding the gate of the nanosheet field-effect transistor and the gate of the fin field-effect transistor, wherein the gate spacer of the nanosheet field-effect transistor has a different thickness than the gate spacer of the fin field-effect transistor.

3. The semiconductor structure of claim 2, wherein the gate spacer surrounding the gate of fin field-effect transistor is thicker than the gate spacer surrounding the gate of the nanosheet field-effect transistor.

4. The semiconductor structure of claim 1, wherein the gate of the nanosheet field-effect transistor and the gate of the fin field-effect transistor include a gate dielectric, wherein the gate dielectric within the gate of the nanosheet field-effect transistor is thicker or thinner than the gate dielectric within the gate of the fin field-effect transistor.

5. The semiconductor structure of claim 1, wherein the nanosheet field-effect transistor is a p-type gate-all-around nanosheet field-effect transistors.

6. The semiconductor structure of claim 1, wherein the nanosheet field-effect transistor is a n-type gate-all-around nanosheet field-effect transistors.

7. The semiconductor structure of claim 1, wherein the first portion of the substrate is a logic device region, and the second portion of the substrate is an I/O device region.

8. The semiconductor structure of claim 7, wherein the logic device region includes the p-type gate-all-around nanosheet field-effect transistor and the I/O device region includes a n-type fin field-effect transistor.

9. The semiconductor structure of claim 7, wherein the I/O device region includes p-type fin field-effect transistor, and the logic device region includes a n-type gate-all-around nanosheet field-effect transistor.

10. A semiconductor structure, comprising:
    a nanosheet field-effect transistor located on a first portion of a substrate, wherein a source drain of the nanosheet field-effect transistor separated from the substrate by an isolation layer, wherein a gate of the nanosheet field-effect transistor is separated from the substrate by the isolation layer, wherein a shallow trench isolation is located beneath and adjacent to the source drain of the nanosheet field-effect transistor, and an etch stop liner is located on top of the shallow trench isolation and a sidewall of the source drain; and
    a fin field-effect transistor located on a second portion of the substrate, wherein a source drain of the fin field-effect transistor is in direct contact with the substrate, wherein a gate of the fin field-effect transistor is in direct contact with a fin of the fin field-effect transistor, wherein the source drain of the fin field-effect transistor contacts the substrate between two adjacent sections of the shallow trench isolation, wherein the source drain of the fin field-effect transistor includes a first portion and a plurality of second portions that extend off the first portion, wherein each of the plurality of second portions and the first portion have different dimensions, wherein the second portion is in contact with the substate.

11. The semiconductor structure of claim 10, further comprising:
a gate spacer surrounding the gate of the nanosheet field-effect and the gate of the fin field-effect transistor.

12. The semiconductor structure of claim 11, wherein the gate spacer surrounding the gate of the fin field-effect transistor is thicker than the gate spacer surrounding the gate of the nanosheet field-effect transistor.

13. The semiconductor structure of claim 10, wherein the nanosheet field-effect transistor is a p-type gate-all-around nanosheet field-effect transistors.

14. The semiconductor structure of claim 10, wherein the nanosheet field-effect transistor is a n-type gate-all-around nanosheet field-effect transistors.

15. The semiconductor structure of claim 10, wherein the first portion of the substrate is a logic device region, and the second portion of the substrate is an I/O device region.

16. The semiconductor structure of claim 15, wherein the logic device region includes a p-type gate-all-around nanosheet field-effect transistor and the I/O device region includes a n-type fin field-effect transistor.

17. The semiconductor structure of claim 15, wherein the I/O device region includes a p-type fin field-effect transistor, and the logic device region includes a n-type gate-all-around nanosheet field-effect transistor.

18. A semiconductor structure, comprising:
a nanosheet field-effect transistor located on a first portion of a substrate, wherein a source drain of the nanosheet field-effect transistor is separated from the substrate by an isolation layer, wherein a gate of the nanosheet field-effect transistor is separated from the substrate by the isolation layer; and
a fin field-effect transistor located on a second portion of the substrate, wherein a source drain of the fin field-effect transistor is in direct contact with the substrate, wherein the source drain of the fin field-effect transistor includes a first portion and a plurality of second portions that extend off the first portion, wherein each of the plurality of second portions and the first portion have different dimensions, wherein the second portion is in contact with the substate, and wherein a gate of the fin field-effect transistor is in direct contact with a fin of the fin field-effect transistor;
a gate spacer surrounding the gate of the nanosheet field-effect transistor and the gate of the fin field-effect transistor, wherein the gate spacer of the nanosheet field-effect has a different thickness than the gate spacer of the fin field-effect transistor; and
a shallow trench isolation is located beneath and adjacent to the source drain of the nanosheet field-effect transistor, and an etch stop liner is located on top of the shallow trench isolation and a sidewall of the source drain, and wherein the source drain of the fin field-effect transistor contacts the substrate between two adjacent sections of the shallow trench isolation.

19. The semiconductor structure of claim 18, wherein the gate spacer surrounding the gate of the fin field-effect transistor is thicker than the gate spacer surrounding the gate of the nanosheet field-effect transistor.

20. The semiconductor structure of claim 18, wherein the gate spacer surrounding the gate of the fin field-effect transistor is thinner than the gate spacer surrounding the gate of the nanosheet field-effect transistor.

21. The semiconductor structure of claim 18, wherein the nanosheet field-effect transistor is a p-type gate-all-around nanosheet field-effect transistors.

22. The semiconductor structure of claim 18, wherein the nanosheet field-effect transistor is a n-type gate-all-around nanosheet field-effect transistors.

23. The semiconductor structure of claim 18, wherein the first portion of the substrate is a logic device region, and the second portion of the substrate is an I/O device region.

24. The semiconductor structure of claim 23, wherein the logic device region includes a p-type gate-all-around nanosheet field-effect transistor and the I/O device region includes a n-type fin field-effect transistor.

25. The semiconductor structure of claim 23, wherein the I/O device region includes p-type fin field-effect transistor, and the logic device region includes a n-type gate-all-around nanosheet field-effect transistor.

* * * * *